United States Patent [19]
Aronstein et al.

[11] 3,946,484
[45] Mar. 30, 1976

[54] CONTINUOUS PROCESSING SYSTEM

[75] Inventors: Jesse Aronstein; William E. Harding, both of Poughkeepsie, N.Y.

[73] Assignee: International Business Machines Corporation, Armonk, N.Y.

[22] Filed: May 1, 1975

[21] Appl. No.: 573,632

Related U.S. Application Data
[62] Division of Ser. No. 329,920, Feb. 5, 1973, Pat. No. 3,889,355.

[52] U.S. Cl. .............................. 29/569 R; 29/563
[51] Int. Cl.² ......................................... B01J 17/00
[58] Field of Search .......... 29/569, 33 P, 563; 118/6

[56] References Cited
UNITED STATES PATENTS

| | | |
|---|---|---|
| 3,047,933 | 8/1962 | Chick .................................. 29/569 |
| 3,530,571 | 9/1970 | Perry ................................... 29/563 |
| 3,543,392 | 12/1970 | Perry ................................... 29/563 |
| 3,576,540 | 4/1971 | Fair ...................................... 29/563 |
| 3,618,199 | 11/1971 | King ..................................... 29/569 |

*Primary Examiner*—W. Tupman
*Attorney, Agent, or Firm*—Henry Powers

[57] ABSTRACT

A manufacturing system utilizing a plurality of satellite functional processing stations or sectors, each capable of stand-alone operation. The stations are interconnected by a handler or conveyor, which will transport individual ones of work-pieces from one processing station to the next in accordance with a prescribed sequence corresponding to the processing requirements for the workpiece.

16 Claims, 25 Drawing Figures

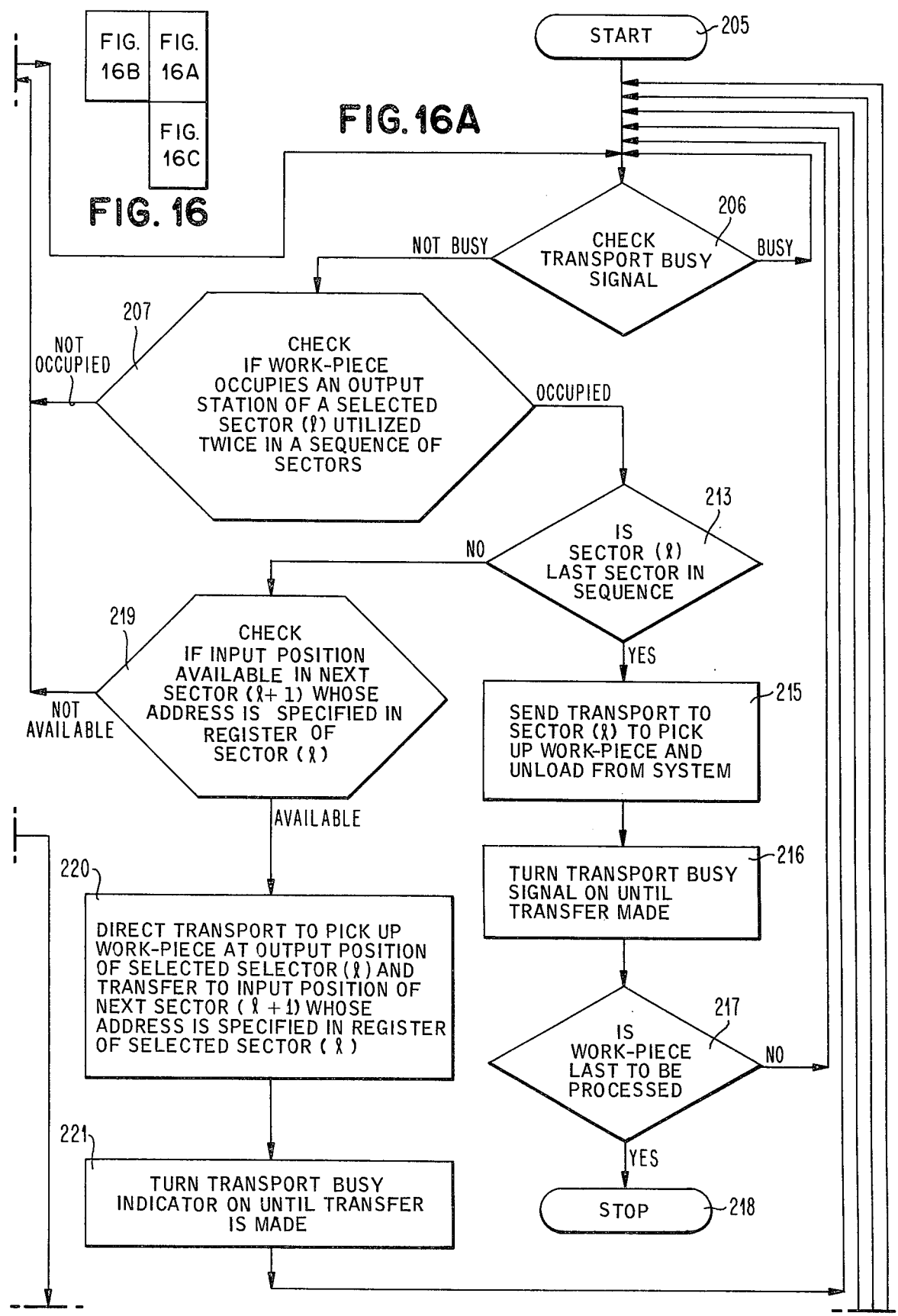

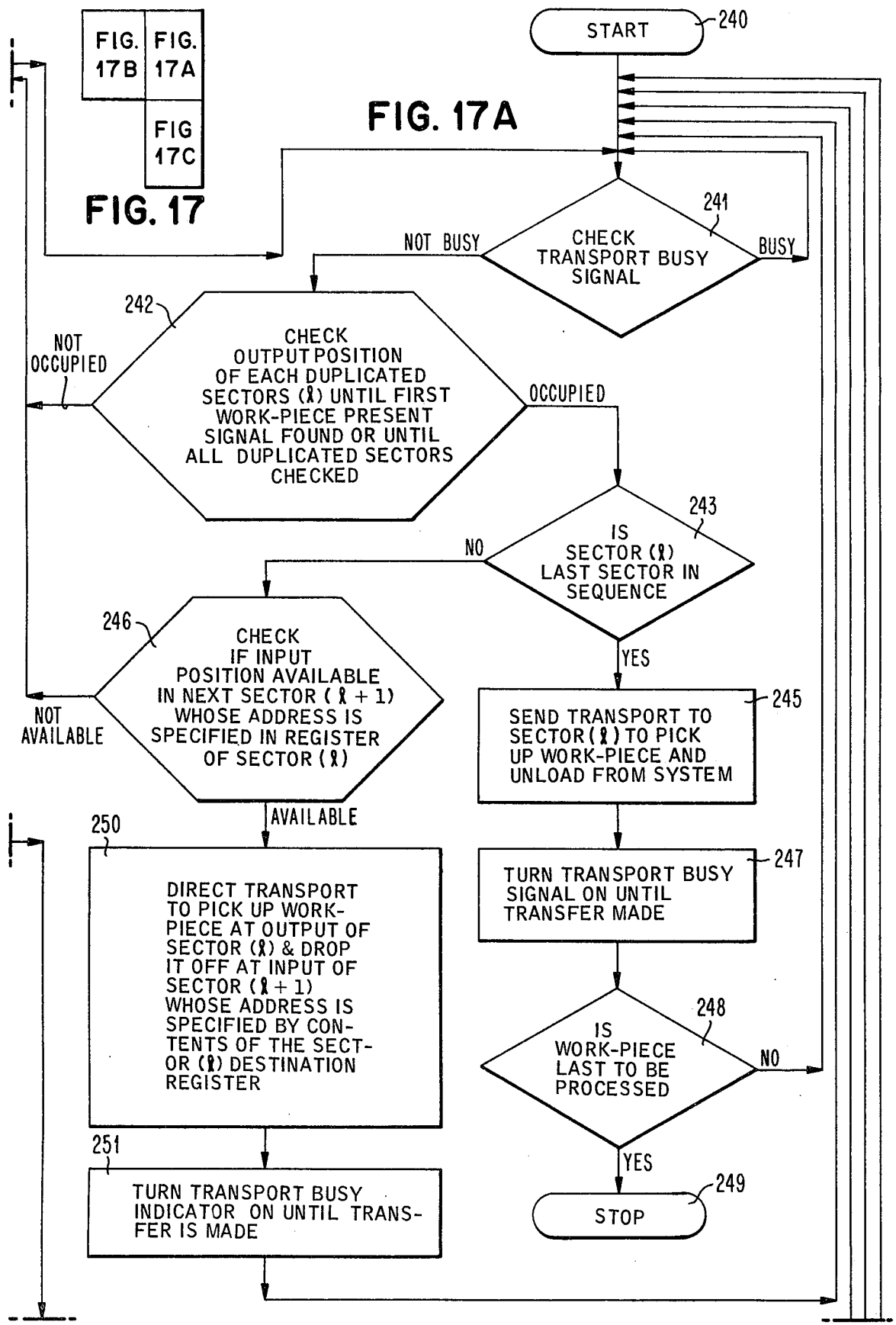

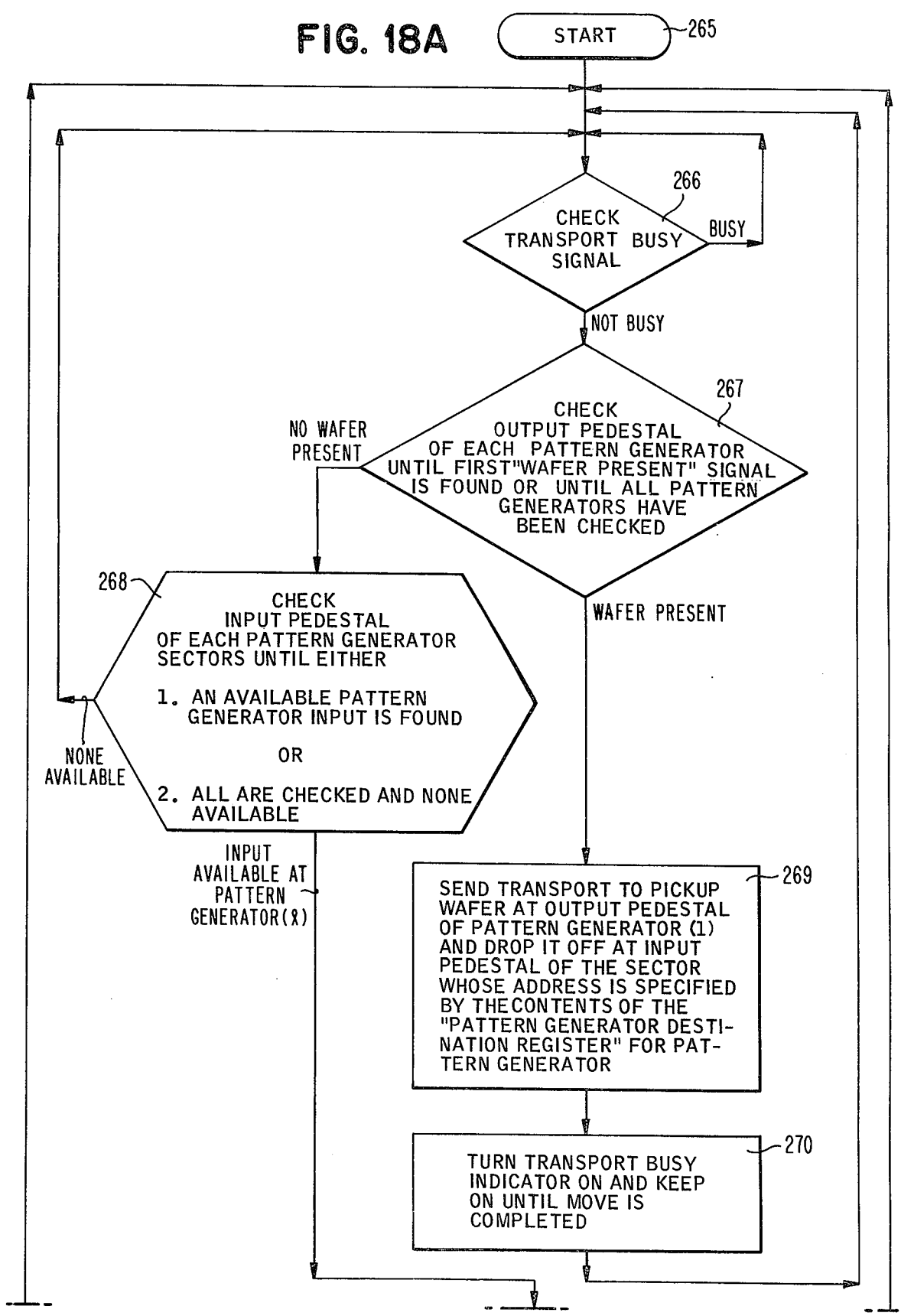

CONTINUOUS PROCESSING SYSTEM

This is a division, of application Ser. No. 329,920 filed 2/5/73, now U.S. Pat. No. 3,889,355.

FIELD OF THE INVENTION

This invention is directed to a complete manufacturing system which has capability of fast turn-around, maximized yield and low in-process inventory. More specifically, the manufacturing system of this invention is directed to operations involving the processing of multiple part numbers wherein the cost of base material and processing is trivial with respect to add-on value, and wherein the improvement comprises the interdependent minimization of processing cycle time and miximization of completed part yield.

Although the invention has general application to a wide range of manufacturing systems for processing a corresponding scope of work-pieces, it will be illustratively described with specific reference to a semiconductor manufacturing system to which environment the invention was developed.

DESCRIPTION OF PRIOR ART

As background for the development of the invention in the semiconductor processing environment, it may be noted, that during the early 1960's the industry at large engaged in extensive manufacture of planar semiconductor structures, particularly with respect to silicon diodes and/or transistors. In the processing of semiconductor wafers (e.g. silicon), there were two clearly identifiable modes of batch processing. The first was the wafer itself, where, within it, batching was accomplished by forming a plurality of identical transistors or diodes. Typically, a 1.25 inch diameter wafer could contain 1000 transistors. For purposes of discussion, this mode of batch processing is defined as "WAFER BATCHING".

A second mode of batching, herein called "MULTIPLE WAFER BATCHING" was also identifiable in various production lines. A typical example of the form of batching in a diffusion step, might employ the processing of 200 wafers simultaneously.

In order to increase output and to lower costs, various manufacturing systems developed throughout the 1960's exploited each of these batching modes.

With respect to WAFER BATCHING it may be noted that this mode of operation does reduce the separate cost/device of each manufacturing step.

One way to improve the advantages of WAFER BATCHING is by increasing the size of the wafer, which over the years has progressively increased in sequential steps from an initial diameter of 0.75 inches to presently advanced use of 3.25 inch diameter wafers. However, although such WAFER BATCHING can economically improve thruput of a system, it frequently requires significant re-tooling to accommodate its increasing wafer size. Jigs, handlers, racks, etc. may all have to be redesigned and old tools obsoleted. Frequently, significant process modifications must be developed (with their associated costs) to accommodate tool and process. For example, a completely new diffusion furnace design may be required for an increase in wafer size. In addition, extensions of WAFER BATCHING rarely raise yield, and in fact, tend to decrease it.

Examples of improvements over the years utilizing MULTIPLE WAFER BATCHING are numerous, typical of which is the use from 8 to 18 and then up to 35 wafers in metallization operation; from 8 to 20 and then to 70 wafers in epitaxial reactors, and from 10 wafers to as many as 300 batched wafers in diffusion operations.

This mode of batching has some significant negative consequences. First, it is usually done independently for each operation. Thus, the improvement enhances only the thruput and cost for that particular operation. Secondly, it leads to gross batch size mismatch throughout the line creating larger in-process inventories and, thirdly, the technique usually results in process times for the operation itself to be increased. Slight reduction in process yield for the operation is a common result. It should be pointed out that neither of these batching modes affects the number of chips which must be tested and this part of the fabrication contributes significantly to total chip cost.

With the advent of monolithic integrated circuits, a third batching mode was added which herein is called "CHIP BATCHING". This third mode is simply the exploitation of large scale integration as seen and discussed within the semiconductor industries. Typically, this technology permits the increase in the output of a single chip from one transistor to over 1400 individual transistors and resistors in typical integrated circuits. Normally, this increase of more than 1400 times is paid for by only increasing chip size.

It is the considered opinion of the inventors, of this application, that future improvements in the manufacturing system can make little or no gains in "MULTIPLE WAFER BATCHING". Similarly, systems based upon extensions of WAFER BATCHING can make few gains while running the risk in geometrical problems involving size fragility of wafers, mechanical registration, thermal gradients, etc. are likely to further degrade yields.

On the other hand, CHIP BATCHING for large scale integration is just beginning with the potential of increasing thruput at least another factor of at least 10 at perhaps no more than at a price of increasing chip areas by factors of 2 to 4 times. Simultaneously, also obtained will be the added value of the integrated product, reduced testing cost minimized potential tooling changes and reduced packaging costs.

Irrespective of the batching mode employed, the fabrication of semiconductor devices involves a sequence of many process steps. The number of processing steps varies and is determined by the kind of product and its complexity. The sum of the times required to do all the steps and sequence is called "PROCESSING TIME" and is typically 40 to 60 hours of the total production time. Factories based upon MULTIPLE WAFER BATCHING have longer PROCESSING TIME because the tools, while handling many parts simultaneously, also have characteristics which add to the processing time (longer outgassing time or cooling time in an evaporator, for example). In addition their loading, unloading, and set up times are frequently longer.

In addition to the PROCESSING TIME, the total cycle time for wafer fabrication includes QUEUE times, which in fact make up the major part of the total time of fabrication. In today's manufacturing lines, total QUEUE times are typically 40 to 60 days. Wafers Queue for many reasons such as the time to assemble the MULTIPLE WAFER BATCH, equipment down time, waiting while masks are matched to job lot, etc. Individual times can become so long, that extra cleaning steps may be required which in turn increase PROCESSING TIME.

SUMMARY OF THE INVENTION

In contrast to the foregoing, the manufacturing system of the invention disclosed herein is characterized with substantially lower PROCESSING TIME and queue times. Each individual process tool is specified so that all of them will function in concert to fabricate a wafer quickly without waiting. In most operations, if not all, wafers will be individually processed on a first-in first-out basis. Instead of designing tools for large throughput with a sacrifice in yield or dependability, the manufacturing system of this invention comprehends a system with the objectives of high yield and highest dependability of manufacturing equipment.

In its broaded concept, the invention comprehends a manufacturing system in which the processes to be performed are implemented by tools which are grouped together in sectors. A central transportation system moves product from one sector to another.

In application a manufacturing process of interest is partitioned into functional parts or sectors. Each part consists of a set of process steps designed so that before and after which, the work product may be stored for some period of time without degradation in product quality or expected yield. The reason for partitioning the process this way is to allow accommodation of equipment failure and repair.

The process sectors are comprehended as asynchronously operating processing plants which accomplish a set of process steps. Upon sensing the presence of a work-piece at the input port, the sector controls cause the units to be processed through the entire sequence of steps in that sector and, after passing, optionally through an output buffer, to an output port for pick up by the central transport. In accordance with well known techniques, measurements are provided within a sector to allow confirmation of proper operation of tools within the sector and in some cases where desired, to provide send-ahead information for adaptive process controls to be applied in subsequent process sectors. Each of the sectors is also envisioned to be under suitable control, either by general purpose computer or a hard-wired system, to specify and maintain process parameters, and to maintain proper flow of work-pieces for the sector.

The central transport system consists of one or more mobile work-piece carriers which can be commanded to pick up a work-piece from the output port of one sector and bring it to the input port of another sector. The central transport is operated under a control system which can be pre-programmed to specify the required sequence of sectors through which the work-piece is to be transported so that it may undergo a prescribed sequence of processing operations. Logistic control is also contemplated to be employed to enable the work-pieces to be processed on a first-in first-out sequence. In operation a control system enables the transport to travel to any of the input or output pedestals of a prescribed sequence of selected sectors for pickup or delivery of the work-piece as required by the processing schedule.

Normally, the work-piece will enter the system via a loader built into the overall system or into the initial process sector which will perform an initial set of operations on the work-piece. Upon arrival at the output pedestal of that sector, the central transport handler will be commanded to pick up the work-piece and deliver it to the next (process sequence-wise) process sector, provided that the next sector is known to be in operating condition. If the next sector is down, work-pieces can be temporarily stored in a buffer unit until the sector condition can be rectified. Upon arrival at the next sector, the work-piece will be taken through its series of process steps with arrival at an output pedestal for transport to the next sector in the prescribed sequence of sectors.

Repeating this throughout the line, each work-piece in sequence is taken through the manufacturing steps from start to finish. The intra-sector work-piece flow can normally be accomplished by local controls which may be dedicated to each sector. This mode of operation provides for a fail - soft operation, independent installation and debug of process sectors, featurability of additional process sectors, and accommodation of sector outage due to the equipment failure.

In the simplest form, a total manufacturing system comprehended by this invention can be viewed as comprised of three parts. The first consists of the processing, the specifications and the product, design etc; the second involves the physical tools which execute the processes and in turn, form the product; and thirdly, the system utilizes controls which regulate the line activity, commands its action and records the status of the production line as for example, production control and supervising the flow of product and material.

The manufacturing system, as further described below, enables product demand to be made in a short time, thus enabling response to changing orders to be maximized, and facilitates reaction to engineering changes. The short processing times enabled by the manufacturing system of this invention also helps in reacting to and correcting out-of-control condition.

A more complete understanding of the invention may be had by reference to the following more detailed description taken in conjunction with the accompanying drawings wherein.

DESCRIPTION OF PREFERRED EMBODIMENTS

Figure 1:
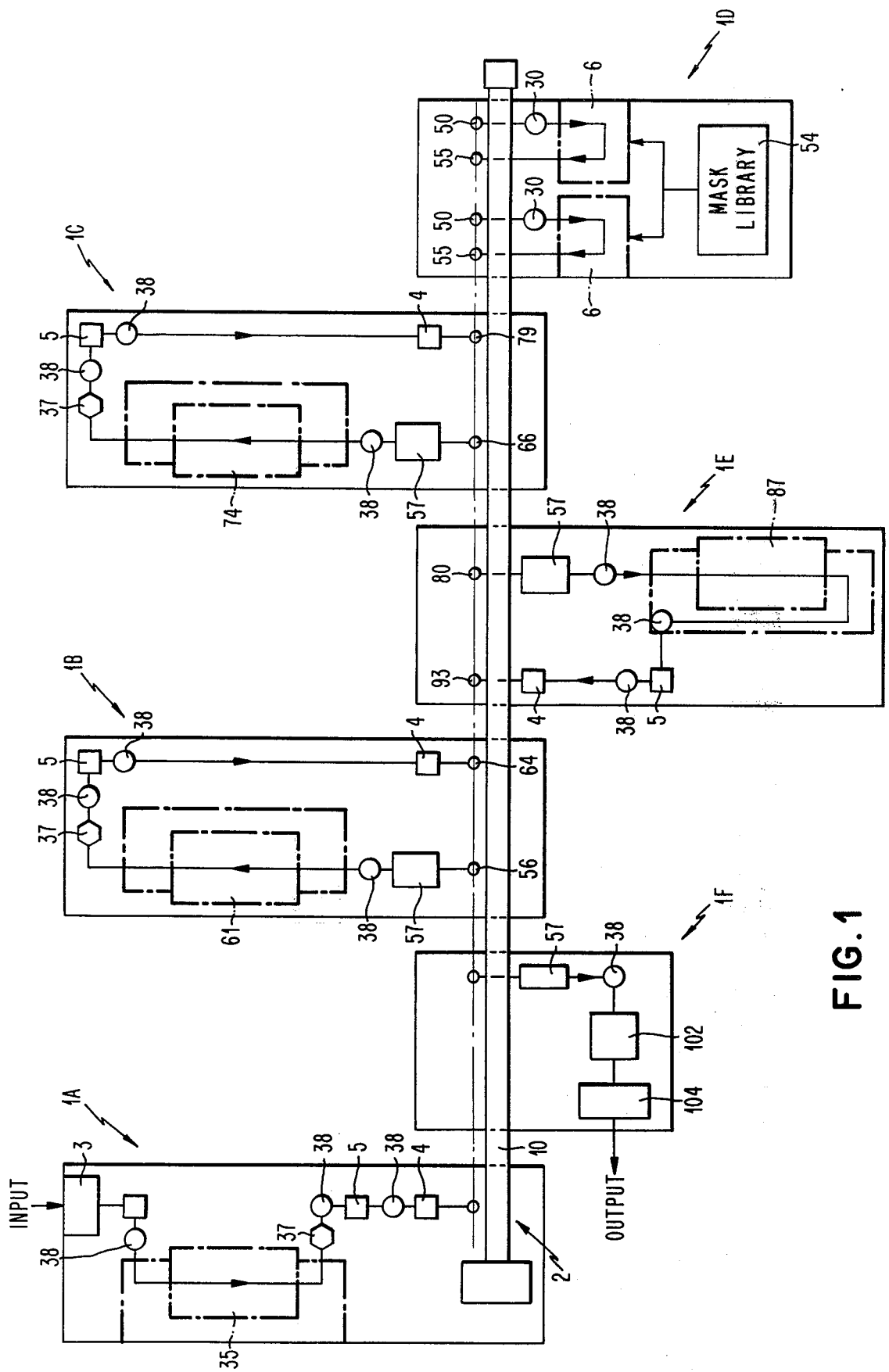
FIG. 1 is a diagramatic representation in plan view of a manufacturing system embodying the principles of the invention of this application.

Referring to FIG. 1, a manufacturing system is shown whose overall processing operations are partitioned into processing stations or sectors 1A to 1F, each sector comprising a set of processing steps before and after which the product may be stored for some period of time without degradation. Sectors 1A to 1F are in effect unit manufacturing plant which accomplish a set of processing steps, and which may have a temporary product storage unit at the output end. Although only six processing sectors are illustrated, it is to be understood that as many sectors as may be required to accommodate the total output of a plant, may be employed from which their preselection and sequencing effected by means of suitable control units well known art for controlling the transfer of a work-piece between the various sectors by a central transport unit or conveyor, generally indicated by numeral 2.

In operation, work-pieces are brought to the input port or loading position of each sector by the central transport unit 2. Upon sensing the presence of a work-piece at an input port or position, the controls of that process sector cause the work-piece to be processed through the entire sequence of steps incorporated in that particular sector, and after passing through the processing operation of that sector, the work-pieces are brought to the output port of that sector for pickup by the central transport for transportation and transfer to the next required sector in a prescribed sequence of work sectors specified by the control unit regulating movement of transport 2.

The central transport 2 may include one or more mobile work-piece carriers which can be commanded to pick up a work-piece from the output port or unloading position, of one sector and bring it to the input port of any other specified sector. Normally, as further described below, a servo control enables the transport to travel to any of the input or output ports or station of the various sectors for pickup or delivery of a work-piece as directed by the control unit.

Where the manufacturing system of this invention is adapted to the manufacture of semiconductor devices, each of the work sectors 1A to 1F will have all the tooling required for effecting one or more semiconductor processing operation assigned to the sector, as for example such as epitaxial growth, metallization, photoresist development, oxide etching, photoresist stripping, impurity diffusion, impurity drive-in, metal etching, formation of dielectric coatings, sputtering, ion implantation, photoresist coating operations, and the like.

For purposes of illustrating a typical semiconductor manufacturing system, the system of FIG. 1 may be correlated to the production of field effect transistor circuits. In such applications, the system will contain all the tooling required for producing the field effect transistors circuits, inclusive from raw wafer through aluminum sinter. For production of field effect transistor circuits, the system will include an initial oxidation sector 1A; a source and drain deposition sector 1B; a gate oxidation sector 1C; a pattern generating sector 1D; a metallization sector 1E; and a sintering sector 1F. Except for the align and expose sectors, the tooling in each of the remainder sectors will be dedicated for each processing series of steps. Normally, single wafers will enter the system at a gated rate and proceed through the sectors on a first-in, first-out basis. Preferably, buffering will be provided at the output ports of sectors 1A, 1B, 1C and 1E to accommodate any equipment unreliability. Although the buffer units in each sector may take any desired configuration a typical one can be exemplified by that described in co-pending application U.S. Ser. No. 203,374, filed Nov. 30, 1971 and assigned to the assignee of this application.

Wafers can be fed into the system via any suitable loader 3 built into the initial sector, e.g. initial oxidation station 1A, which sector will generally perform a set of cleaning operations, growth of an oxide on the wafer, and the application of a layer of photoresist material over the oxide coating.

In addition, it is to be noted that photoresist applyand-dry and develop -etch-strip operations are coupled into the appropriate hot process sectors to enhance adhesion and cleanliness. These parts of the photolithographic operations are distributed throughout the line in a manner designed to maximize yield and minimize control complexity.

Align and expose apparatus is common for all levels, although the featureability of this system allows the use of various methods where justified for yield, cost, etc.

As indicated previously, the various processing sectors are connected by a central transport system 2 which will include a wafer handler which can pick up a wafer from one sector and deposit it at another. The handler operates on one wafer at a time for sake of mechanical and control simplicity. In the specific FET processing operation shown, the wafer will be transferred eight times during complete processing.

The process sectors 1A to 1F are grouped around the handler as satellite stations so as to simplify the facility. Hot processing sectors are grouped in one area, align and expose section at another, thus facilitating the installation and maintenance of specific environments and services required for each type of tool. For example, the align and expose equipment may require an air-conditioned enclosure, whereas the hot processing equipment may require exhaust ventilation.

The manufacturing system includes four main buffers one at the output of each hot process sector, e.g. initial oxidation sector 1A; source and diffusion deposition sector 1B; gate oxidation sector 1C; and metallization sector 1E. There is normally no need for buffers at the output of the pattern generators units 6 in the resist expose sector 1B, since their internal capacity is only one wafer. Provision may be made however for a one wafer buffer capability at the input to any of the develop-etch-strip operations of the other sectors to allow for the possibility that a sector may go down while a wafer destined for it is in the align and expose stations. As will be obvious, it is desirable to clear the pattern generating units 6, in the expose sector 1B, so that other levels can still be processed.

Temporary wafer storage buffers 4 are placed at points in the process where storage time does not effect yield, as for example, after the resist apply-and-dry units 5 (in work sectors 1A, 1B, 1C, and 1E) which operation is employed prior to the align and expose operation in the pattern generating units 6 of the resist expose sector 1D. In practice the manufacturing system will be designed with a built-in over capacity of all processing sectors to allow queues to be absorbed after a down-sector is repaired. Operation of the overall manufacturing system is asynchronous; each work sector or sub-sector to operate on a wafer as soon as it arrives, until its maximum repeat rate is reached.

The first-in, first-out one-wafer at a time operation makes it relatively simple to contain a part number mix problem. A large variety of different part numbers can be processed using a minimal production control support system to track wafers within the line. In a production system of this type with a high part number mix, wafer serial and/or part number identity can be verified prior to any of the last three align and expose steps. This can be done during transist in the wafer handler of the central transport unit 2 by relatively simple equipment and state-of-the-art techniques.

Illustrative of such part mix-processing, is the fabrication of an interspersed flow of different part numbers of a family of wafers in which the processing parameters of the various processing sectors, with the exclusion of the pattern generators 6, are substantially the same. In this respect personalization of the various part numbers is effected by suitable reading of the wafer serial and/or part number, to select the appropriate pattern for exposing the resist coated wafers at their various levels of processing corresponding to the particular part number of the product mix flow.

Figure 2:
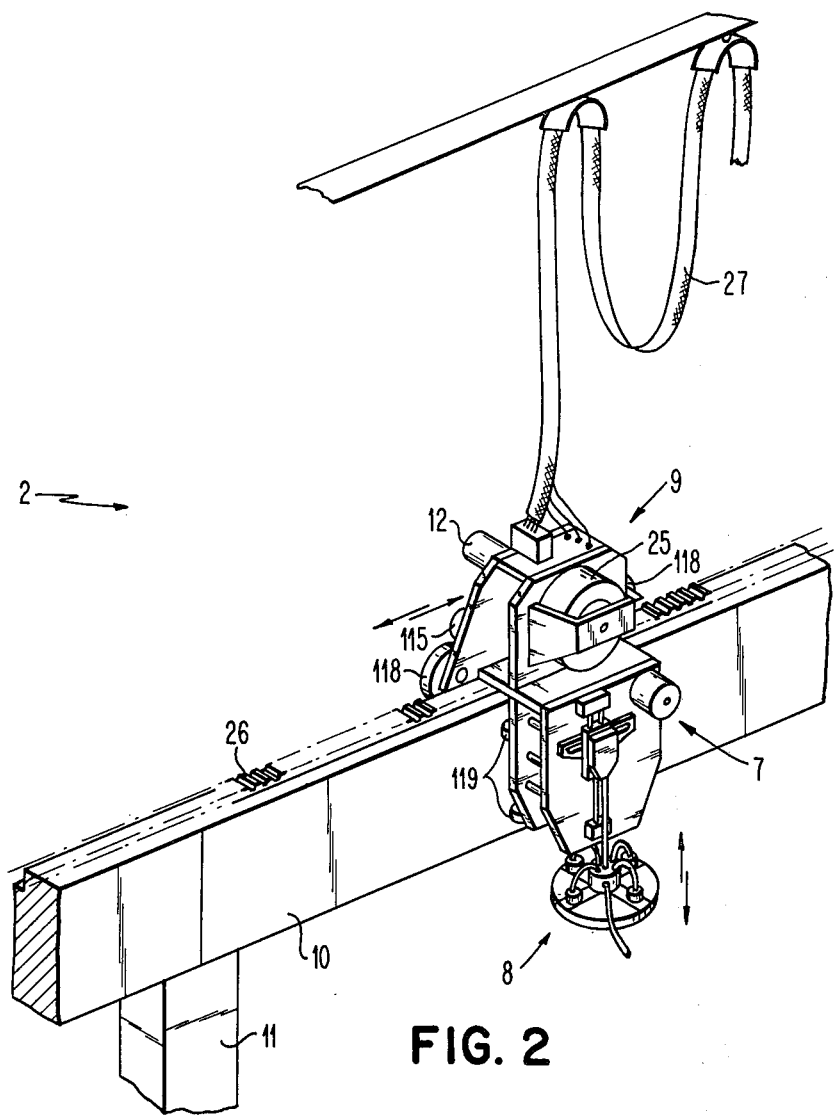
FIG. 2 is a diagramatic representation in perspective of a transport system suitable for use in the manufacturing system of this invention.

The central transport system 2 can comprise one or more mobile wafer carriers 7 which will include a wafer pickup and release mechanism 8 on a carriage 9 which travels along a guide rail 10 as illustrated in FIG. 2. As shown in the drawing pedestals 11 support the guide rail 10 above the load and unload pedestals of the various process sectors or stations. In general, input and output positions of all process sectors are on the line below the guide rail. Wafers are picked up, carried and deposited in a horizontal face-up position.

Figure 3:
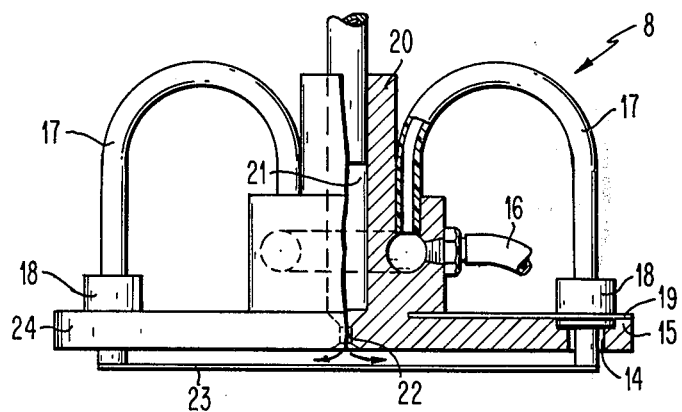
FIG. 3 is an elevational view, partly in section, of a wafer chuck which can be employed in association with the transport system of FIG. 2.

Wafer pickup can be accomplished by a version of the Bernoulli probe, such as shown in FIG. 3 as part of the wafer lifter mechanism, or preferably the wafer pick-up can be of the type shown and described in copending application U.S. Ser. No. 319,563 filed Dec. 29, 1972 (IBM Docket FI9-72-137) assigned to the assignee of this application. The wafer pickup 12 illustrated in FIG. 3 comprises a base plate 15 formed with a plurality of peripheral apertures 14 through which are mounted a radial assortment of flexible tubing 17 connected with a vacuum manifold 15 coupled to a source of pressure at the vacuum inputs 16. Mounted about each of the tubings 17 is a yoke unit 18 in which is secured a light leave spring 19 which is anchored at its other end in the body portion 20 to bias the free ends of the tube 17 uniformly out of the front face of support plate 14 so as to secure a wafer thereto when the vacuum is turned on at an appropriate time. Extending through the body portions 20 is an air passage 21 connected to source of positive gas pressure to eject a source or stream of gas out of the nozzle 22 to provide a Bernoulli effect which will raise a wafer 23 against the open ends of tube 17 for securing a wafer thereto under pressure. As it will be noted the tubes 17 are spaced about base plate 24 for engagement about corresponding peripheral portions of wafer 23.

In general the carriage assembly 9 comprises the pickup head 8, a Z-motion drive motor 7, a drive motor 25 for driving a pinion gear 12020 along a rack 26 secured on the upper surface of support rail 10. In general, information for driving or for controlling the movement of the transport system 2 will be transmitted by means of a service cable 27 extending from a control unit which specifies the selected sequence of process sectors through which the wafer is to be sequenced; which sectors are available for wafer input; senses the presence of a wafer available for pickup at the output of a sector; senses carriage status (availability to pick up a wafer); and carriage location. More specific details of the transport will be described below.

As indicated previously, the process sectors or stations are configured to accomplish a set of process steps which can be done in a rapid sequence to meet high-yield objective and for this purpose each sector can be optimized to obtain such result. For this reason, the apparatus within each sector is selected on the basis of highest yield potential.

Each sector will also contain adequate timing, motion, and parameter controls to allow for debug and system operation and maintenance. Additionally, an interface can be provided to a control system for data collection, wafer tracking, and, where appropriate, over-riding computer control of critical parameters in accordance with well-established techniques.

Figure 4:
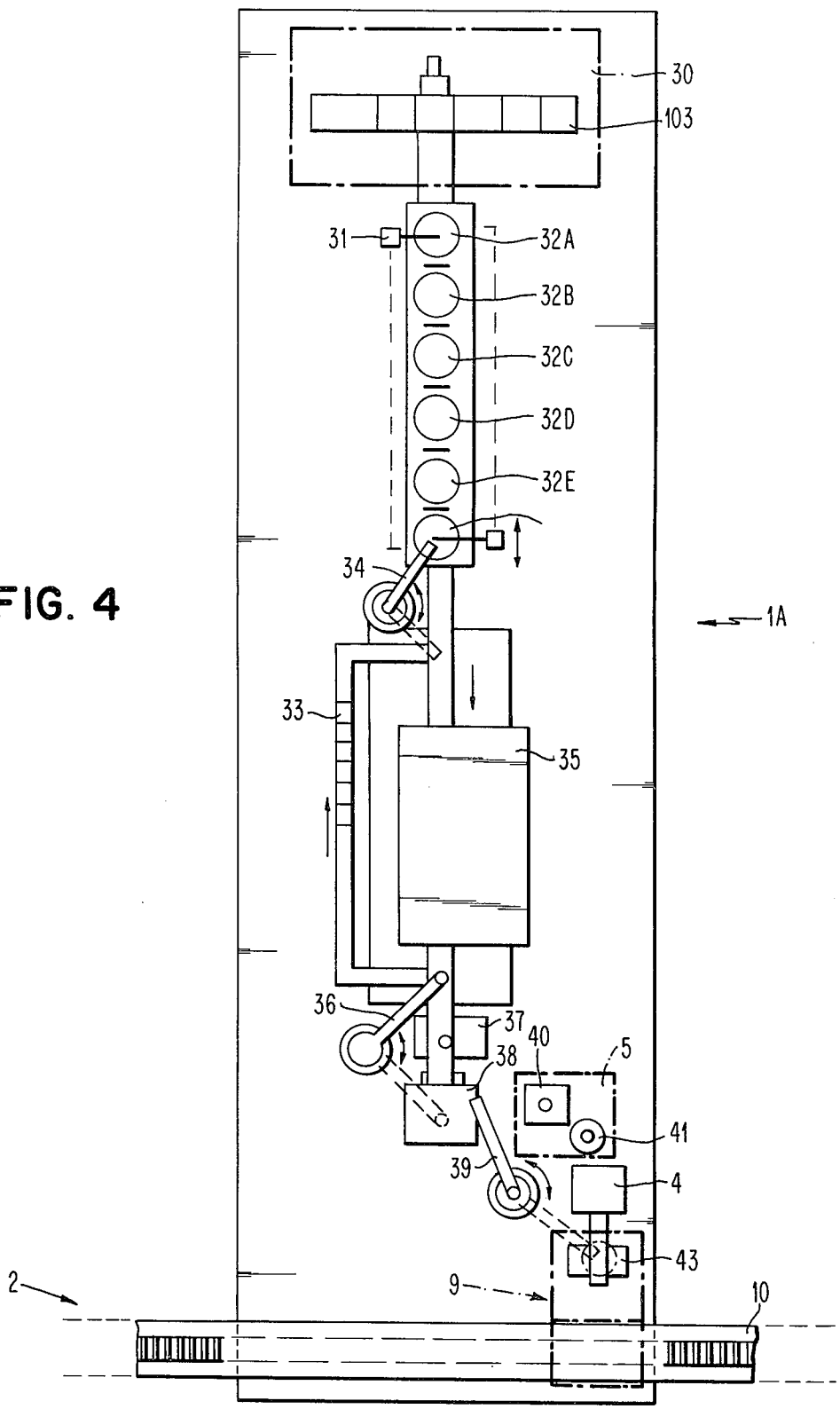
FIG. 4 is a diagramatic representation in plan view of a processing sector in the manufacturing system of this invention adapted for oxidation of semiconductor substrates.
Figure 5:
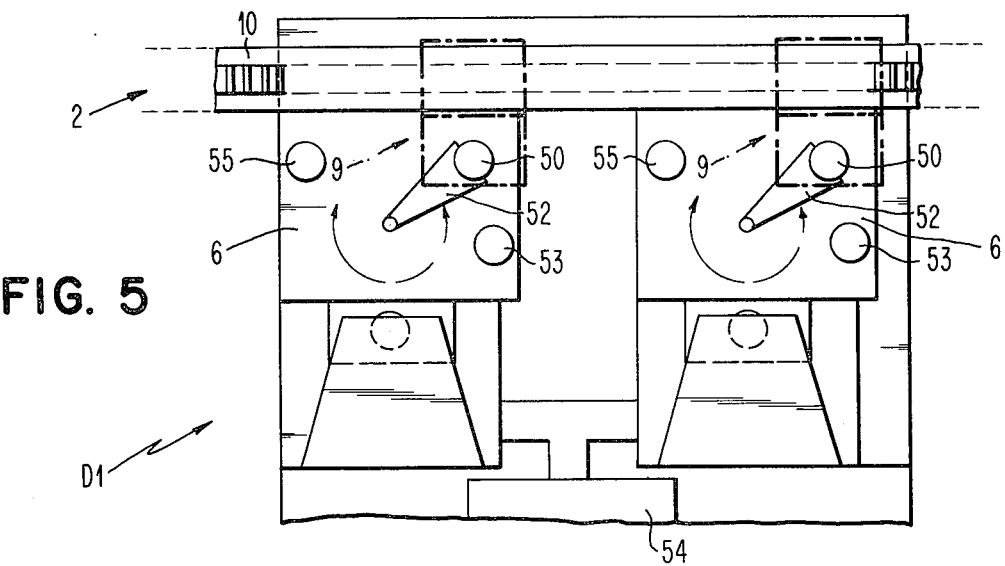
FIG. 5 is a diagramatic representation in plan view of a processing sector in the manufacturing system of this invention adapted for exposing photoresist coatings, on semiconductor substrates, in desired patterns.
Figure 6:
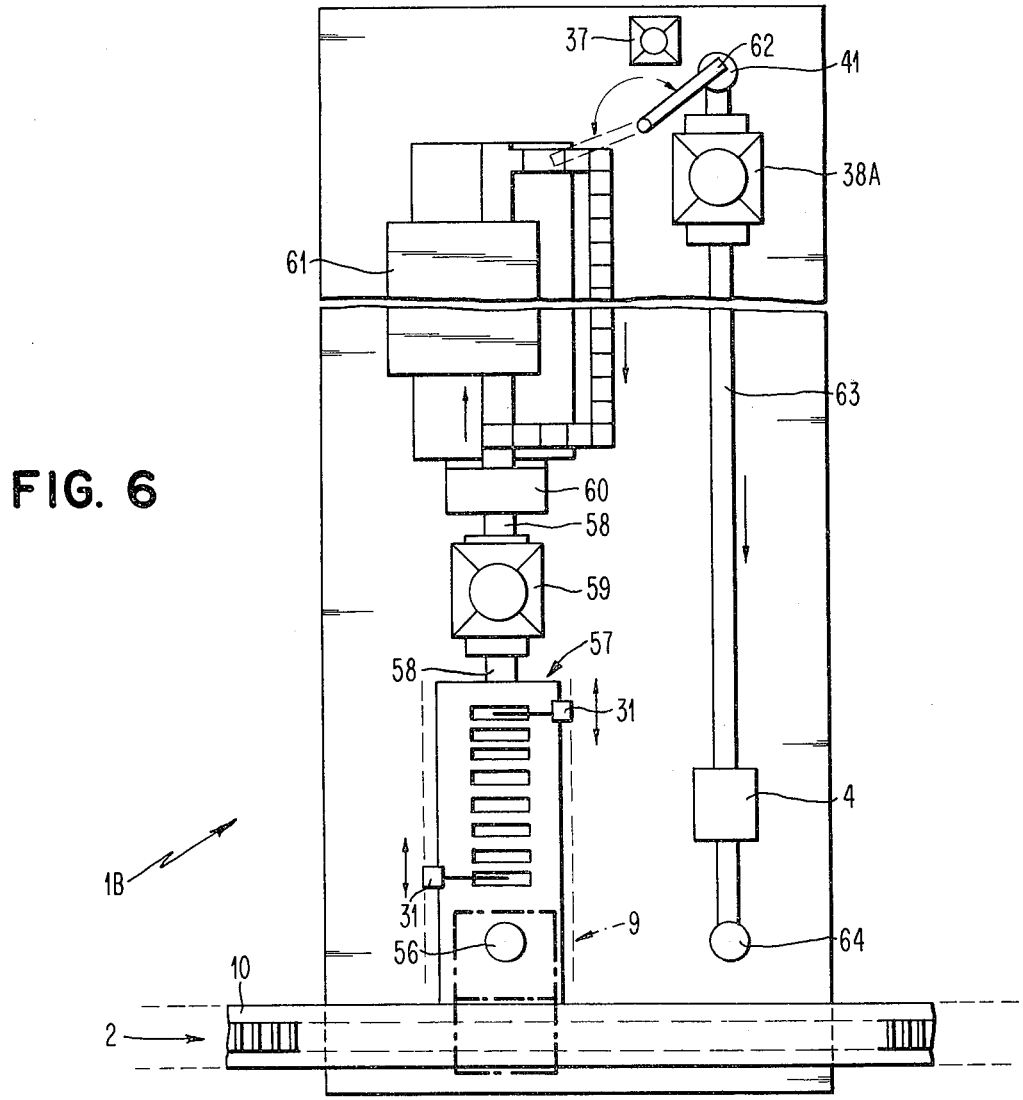
FIG. 6 is a diagramatic representation in plan view of a processing sector in the manufacturing system of this invention, adapted for the formation of source and drain regions in semiconductor substrates.
Figure 7:
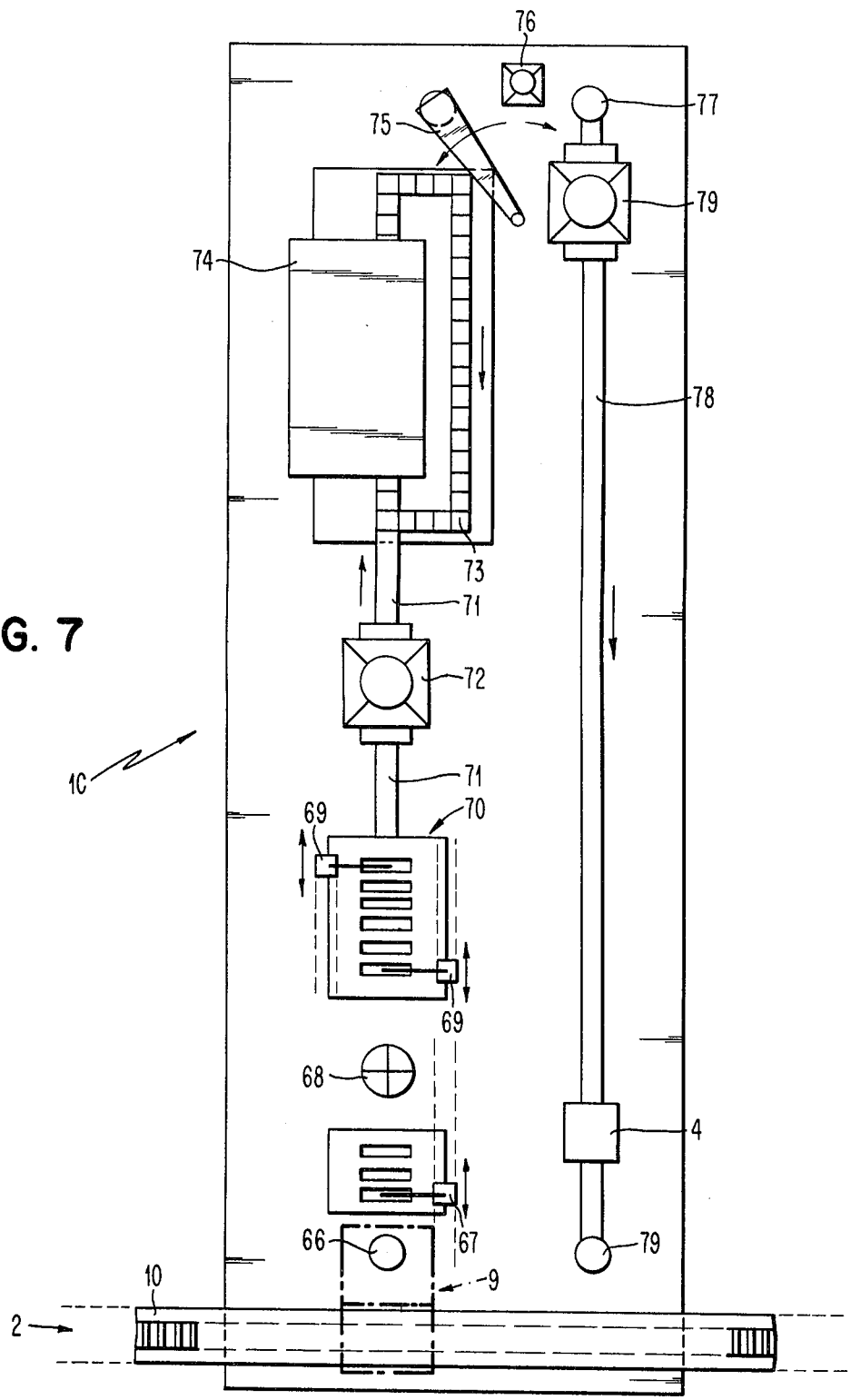
FIG. 7 is a diagramatic representation in plan view of a processing sector in the manufacturing system of this invention, adapted to oxidize a region or semiconductor substrates for the fabrication of field effect transistor devices.
Figure 8:
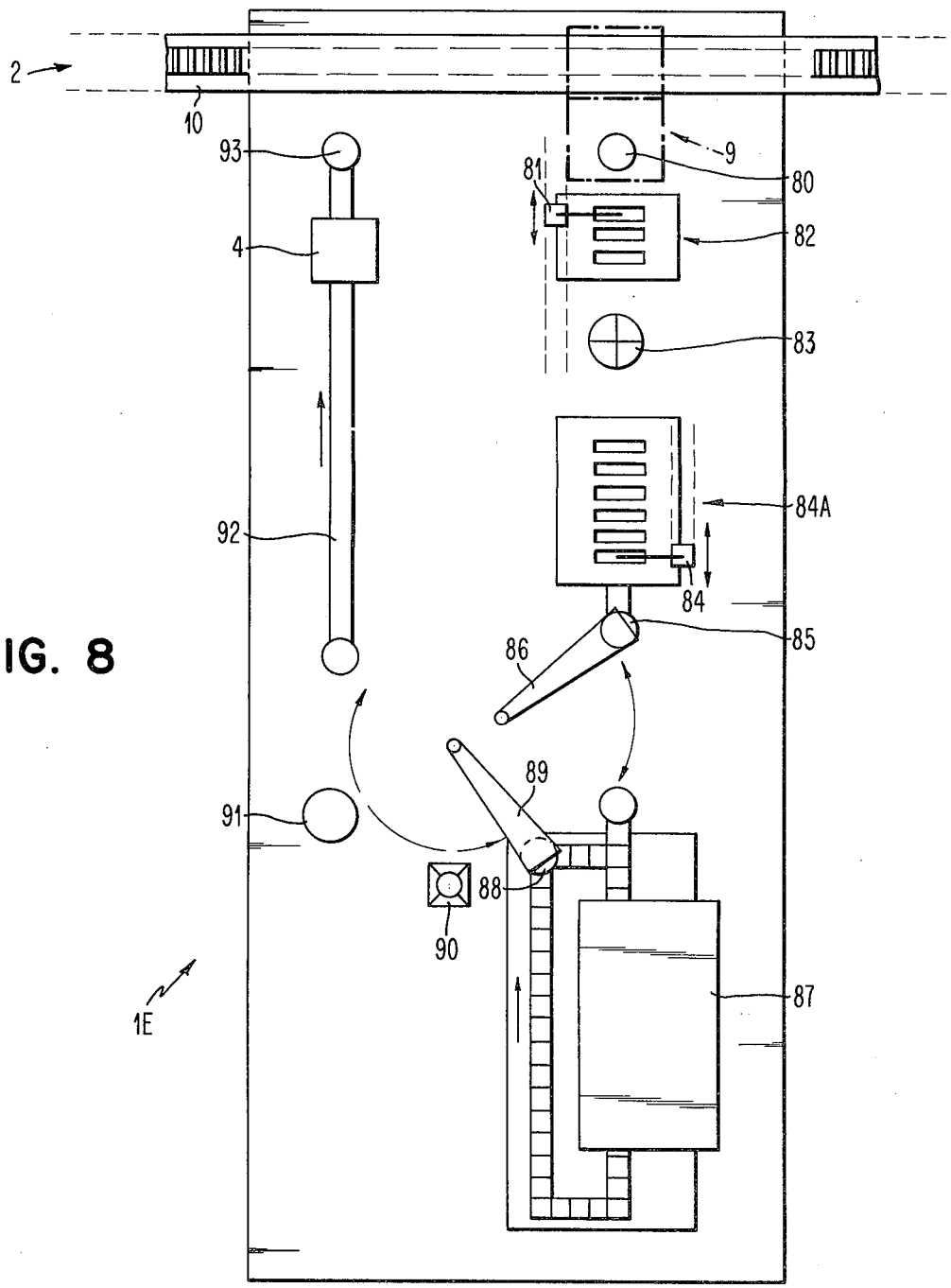
FIG. 8 is a diagramatic representation in plan view of a processing sector in the manufacturing system of this invention adapted to formation of metal coatings on semiconductor substrates.

To initiate the operation, the wafers can be introduced or fed into the initial oxidation sector 1A for chemical cleaning of the inputted wafers so as to remove organic and inorganic contaminates, and then for deposition of thermal oxide and application of photoresist coating. There are five main processing operations or steps in this initial oxidation sector 1A, which are 1. Wafer storage and load, 2. wafer cleaning, 3. initial oxide formation, 4. oxide thickness measurement, and 5. photoresist application and drying. This overall sector layout is shown in FIG. 4.

Prior to introduction in oxidation sector 1A, the silicon wafers to be imputted are pre-inspected and loaded into the sector via linear carriers such as described in the aforesaid copending application U.S. Ser. No. 203,374. The wafers can then be mechanically transported from the linear carrier to the cleaning operation at a specified gated input rate. In general, the wafer cleaning station 29 which will receive wafers from the loading position 30, will comprise a series of wet processing tanks and one dry tank or chamber located at equal intervals in a linear patch. In general, a handler 31 will pick up the wafers in a horizontal position from the load station 30 rotate the wafers 90° in a vertical position, in which the wafers are transported through the wafer cleaning station by the mechanical handler 31. The handler will dip the wafer into the processing tanks or chambers 32A to 32E in sequence for the required times. In general two mechanical handlers 31 are used in the claiming station to achieve increase throughput rate.

The wafers leaving the cleaning station are then transferred by a handler 34 for a suitable orientation at station 36 loading onto moving boats 33 for feeding into the oxidation furnace 35 for processing the wafers in a continuous mode. One suitable continuous oxidation furnace may be of the configuration disclosed and described in U.S. Pat. No. 3,650,042 granted Mar. 21, 1972. In general the wafers will be oxidized in a horizontal position on quartz boats which on leaving the furnace will be cooled for transfer by handler 36 through an oxide thickness measurement tool 37 to a transfer table 38 for pickup and transfer by handler 39 to a spinning pedestal station 40 for application of photoresist with sequencing through a hot plate 41 for drying with eventual temporary storage, if required, in a buffer from which the wafer can be fed to the unloading position 43 for controlled pickup by the central transport 2. Automatic oxide thickness measurements can be used for furnace parameter control verification and for subsequent control of an oxide etching operation in a source and drain diffusion sector or station 1B. Visual observation can also be performed on the wafers at the transfer table 40 at which the wafer can be programmed to dwell for a short time prior to moving on. This will facilitate random visual inspection without significant delay of wafer progress. Principle purposes of the visual observation at transfer table 38 is to help determine operational status at the previous process tooling so that the wafers can continue to be committed to the tools or for stopping the input until corrective maintenance is performed. These inspection stations appear throughout the line as noted on the sector drawings. In general the photoresist application station 40 and the drying station 41 are generally represented by the generalized unit 5 in FIG. 1.

The mechanical handler 39 picks up the wafer from the transfer table 38 and transports it to and within the resist apply-and-dry stations, 40 and 41, respectively. The photoresist apply and dry stations can comprise a single spin/apply station and a simple hot plate. Wafers taken from the hot plate can be deposited on a conveyor leading to the buffer unit 4 where they wait for the transport unit to transfer them to the align and expose sector 1B.

After processing of a wafer through the initial oxidation sector 1A, the wafer at sectors unload an output position 43 to be picked up by the central transport 2, and transported to an available load for input position 30 of one of a pair of pattern generators units 6 in the photoresist expose sector 1D. Each of the pattern generating units 6 may be suitably interconnected with a mask library through which an appropriate number of masks is available for transfer to the pattern generated unit 6 in point for exposing of a photoresist coating on the wafer.

When the wafers are transported to the input position 30 of a pattern generators unit 6, a handler 32 will transfer the wafers to wafer orientation position 33 with eventual transfer within the expose position of pattern generators unit 6. The photoresist expose sector comprehends the use of any conventional resist exposure systems including contact printing, projection printing, and step and repeat techniques. One preferred form of a unit for exposing resist in a required pattern is exemplified by the patent generator unit disclosed in U.S. Pat. No. 3,644,700 issued Feb. 22, 1972. As disclosed in this patent, its pattern generator employs means for aligning a wafer for exposure, followed by use of an ion beam to write the pattern on a photoresist coating in accordance with an exposure program contained in its memory. These exposure programs may be selected from a plurality of ones stored in a mask library memory in association with part numbers which may be appropriately selected in correlation with the specified sequence of selected ones of said work sectors, pursuant to a main control unit for the manufacturing system. Alternately, where conventional semiconductor masks are employed, they may be suitably stored in the mask library 54 from which they are selected for use in the pattern generating unit 6.

After exposure, the handler 52 will transfer the exposed resist coated wafer to an output position 55 to await pickup by the handler of the central transport system 2. When directed by the central control unit, a wafer carrier illustrated in FIG. 2, will pick up the wafer at the output port 55 of the resist expose station 1D for transfer to the input port 56 of the source and drain sector or station 1B. After the wafer is transferred to a load pedestal 56, of sector 1B, it is picked up flat by one of handlers 31, in this sector, rotated 90° and dipped in a plurality of compartments or tanks in the develop-etch-strip section 57, which will contain appropriate solutions for developing the exposed resist, etchants for removal of exposed silicon oxide coatings, and stripping of the remainder of the resist coating, with appropriate rinsing solution dispersed through the section as required. Hardware for the develop/etch/strip operation is essentially the same as for the cleaning operations discussed in sector 1A and is repeated elsewhere in the line. Having completed the source and drain openings, the wafer is then transported on a conveyor 58 in a horizontal position to the source and drain diffusion furnace 61 via a visual observation station 59 which may incorporate automatic wafer orientation mechanisms well known in the art. As shown, the handler 60 will transfer the wafers flat on a queue of quartz boats for traverse through the various process zones of the furnace 61 which may have a configuration such as exemplfied in copending application U.S. Ser. No. 825,827 filed May 19, 1969 and assigned to the assignee of this application. On exiting from the source and drain furnace 61, the wafers will be picked up by handler 62 which can transfer it through a measuring station and a photoresist application station 37, a hot plate 41 for eventual transfer to a visual observation station 38A with subsequent transfer on a conveyor 63 to the output pedestal 64 via a buffer 4 as required when directed by the control unit of the manufacturing system, the wafer transport unit 2 will pick up the wafer positioned on the output pedestal 69 of the source and drain sector 1B for transfer of a pattern generating unit 6; to an unoccupied pedestal 50 in the resist expose sector 1D to delineate the critical gate area of the field effect transistor device in the resist coating on the wafer. After exposure, the wafer is then transferred by a handler 52 to an output pedestal 55 for pickup by the wafer transport system 2 and transferred to the gate oxide sector or station 1C and placed flat onto its output pedestal 66.

In accordance with the controls of the gate oxidation sector 1C, the wafer will be picked up by a handler 67 which rotates the wafer 90° for dipping it into appropriate compartments of a photoresist developing section 68 having appropriate solutions for the development of the exposed resist and rinsing, with eventual transfer to a rotating hot plate 68 for a dry post bake of the resist. At the post bake station, the wafer is automatically placed on a rotary hot plate bake table, after which it is picked up by one of automatic handlers 69 for a six individual dipping operation at section 70 having a plurality of compartments for etch, rinse, strip rinse and blow dry of the processed wafer. The wafer is then placed on a conveyor 71 for transport through an observation station 72 with subsequent loading on boats 73 for passage through an oxidation furnace 74 for formation of a required thickness of oxide. Again, the configuration of the oxidation furnace with its processing tube, can take the configuration exemplified by the aforesaid U.S. Pat. No. 3,650,042.

During the residence of the wafers passage through the oxidation furnace 74 and after having the oxide layer built up to a desired thickness, the wafers will be subjected to an appropriate dopant, such as a phosphorus oxide chloride ($POCl_3$) gas for appropriate modification of the oxide layer. As the wafers exit, the furnace 74 they are picked up by a handler 75 for transfer to station 76 where a photoresist can be spin coated on the wafer with the handler 75 stopping the wafer again to a hot plate 77 for final drying. The wafer is now ready for transfer on a conveyor 78 through a visual observation station 79 and through the buffer 4 to the sector output pedestal 79 where it will be ready to be transferred via the central transport system 2 to the photoresist expose sector or station 1D.

An appropriate command from the central control unit, the central transport system 2 will pick up the wafer on the output pedestal 79, of gate oxidation sector 1C and deliver it to an input pedestal 50 of one of the pattern generating units 6 in the photoresist exposure station 1D. After exposing the desired pattern on a resin coated wafer, the wafer is stepped to the output pedestal 55, of the pattern generating unit 6 employed, for pick up by the central transport system where it will be transported for delivery to the input or load pedestal 80 of a metallizing sector or station 1E.

DESCRIPTION

Pursuant to the scheduling of the control unit in metallizing sector 1E, a handler 81 will pick up the wafer at the sector input 80 rotate it 90° and dip it through a plurality of compartments containing appropriate solutions for a resist development and rinsing of the wafer at section 82 with subsequent rotation of the wafer 90° for flat deposit on a rotating hot plate 83 where it's picked up by handler 84 for dipping in a series of compartment or tanks, for etching of the underlying oxide and rinsing with subsequent delivery to a transfer station 85 where the wafer will be picked up by handler 86 which transfers it to a boat for passage through a metallizing unit 87 whose configuration can be exemplified by the metallizing systems described in the aforesaid U.S. Pat. No. 3,650,042.

The metallized wafers on exiting from metallizing furnace 87 will be conveyed to a pickup station 88 where a handler 89 will transfer the wafer to a resist apply-station 90 where photoresist can be spin cast on the wafer with subsequent transfer to a hot plate 91 for drying of the wafer, and then eventual stepping of the wafer to a conveyor 92 for transfer through buffer 4 to a sector output port or pedestal 93 for pick up by the central transport unit 2 for additional processing in the resist expose sector 1D where the resist will be exposed in a suitable pattern specified by the processing requirements of this system. After exposure of the resist by a pattern generating unit 6 in resist expose sector 1D, delineating the selected areas of a metal film to be removed, the wafer will be picked up by the central transport unit 2 for transfer to a load port or pedestal 94 of sintering sector 1F.

As in the preceeding sectors, the wafer at input pedestal, of sintering sector 1F, is picked up by handler 95 and dipped into and through a plurality of compartments or tanks containing solutions for developing and rinsing the exposed resist at section 96 with transfer to a rotating hot plate 97 for post baking the resist, after which it is stepped by one of handlers 98 through a wet processing station 99 comprising a series of compartments for etching exposed portions of the metallization and subsequent stripping of the remaining portion of the photoresist. After this processing operation a handler 98 transfers the wafer to a visual observation station 100, with subsequent transfer by a handler 101 through a sintering furnace 102. Upon exiting from the sintering furnace 102 the wafers can then be loaded into desired ones or carriers 103 at a system unload position 104.

Figure 9:
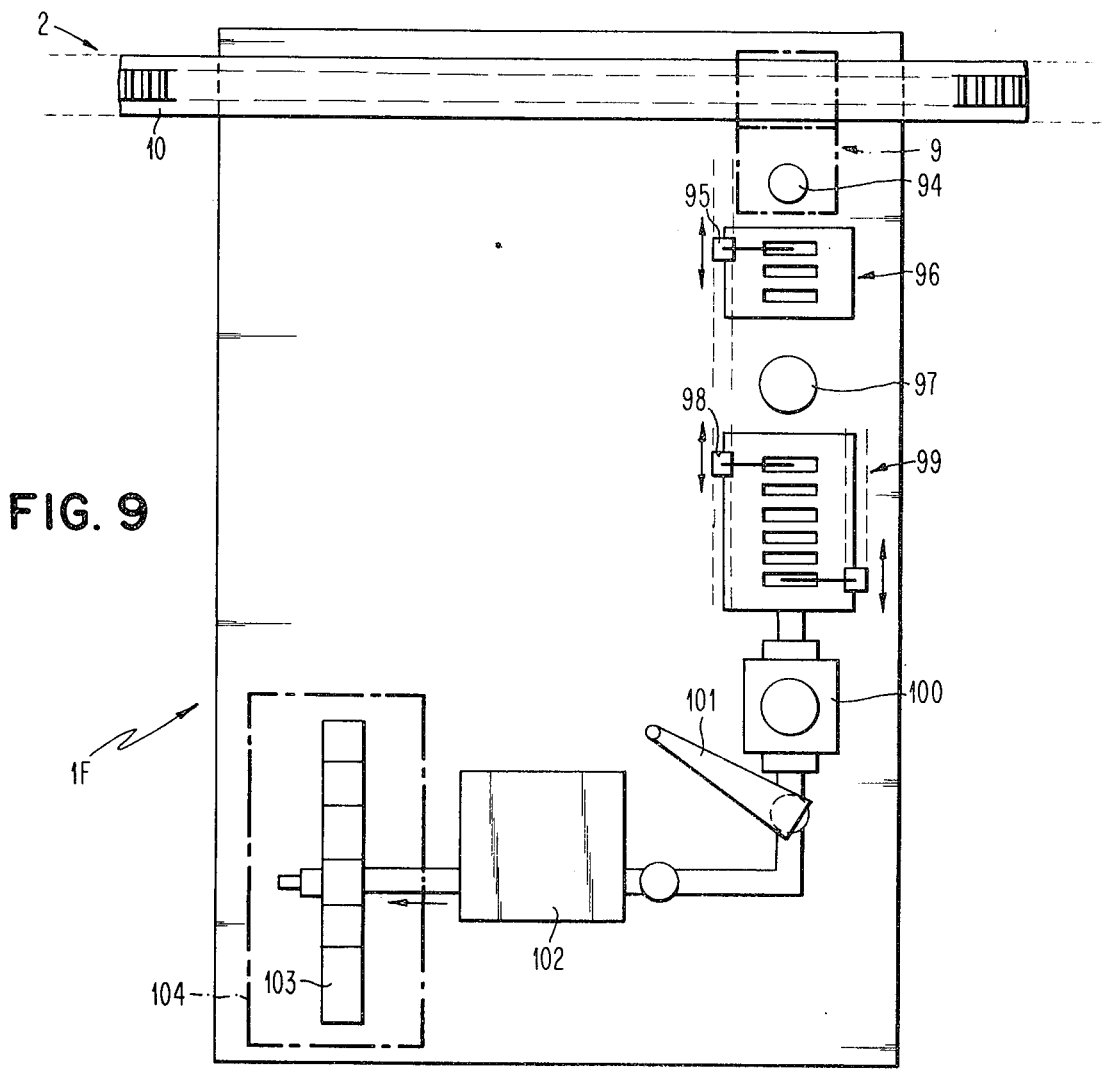
FIG. 9 is a diagramatic representation in plan view of a processing sector in the manufacturing system of this invention adapted to heat treatment of the metal coatings obtained in the unit of FIG. 8.
Figure 10:
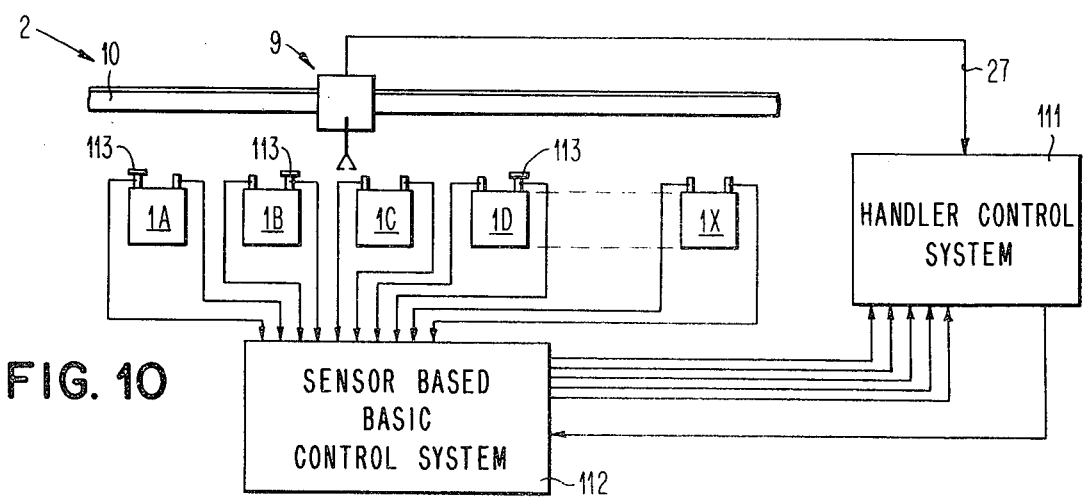
FIG. 10 is a schematic illustration of a control system for use with a manufacturing system in accordance with this invention.

Although the wafer transfer system 2 can take various configuration, one preferred form is that disclosed and described in copending application U.S. Ser. No. 319,563 filed Dec. 26, 1972 (IBM Docket FI9-72-137) assigned to the assignee of this application. As described in this copending application, a schematic overview of this parts handling system is illustrated in FIG. 10. As shown, the central transport system 2 will comprise one or more mobile wafer carriers 9 mounted on a rail 10, with the carrier connected by service cable 27 to a handler control system 111. As indicated above, the central transport system can be commanded at input and output pedestals of each processing sector or station shown in FIG. 9 are distributed along the rail 10 of the transport system. Each of the pedestals associated with the sectors has a "PART PRESENCE" sensor (e.g. photosensor) which sends an electrical signal to a sensor base control system 112, which will perform various functions in the operation of the manufacturing system of this invention, one function of which is to control the movement of parts or workpiece from pedestal to pedestal of the various processing sectors or stations through which the work-piece is sequenced.

The control system 112 will periodically test for a part 113 present at a pedestal. When one is present at an output or unload pedestal, a series of decisions is made before a move is initiated. The designation "output" might refer to the output or pickup point of a tool or collection of tools. The control system 112 decides which tool a work-piece or part 113 should be moved to next, senses that the "input" pedestal or port of the next tool is available (e.g. no part is currently on it) and sends in an address to handler control system 111. The address sent is that of the output pedestal containing the part 113 to be moved. The handler control system accepts this address under control of a servo subsystem (described below). When the move has been completed and the handler 9 has picked up the part, the handler control system 111, which proceeds to move the carriage or handler 9 to the specified address. At the completion of this movement, the work-piece 113 will then be transferred to the input of the next work sector or station required in a preselected sequence sectors. After this movement, the handler control system 111 again sends a movement complete signal to the control system 112, which now can resume it periodic testing of output pedestals for other parts to be moved.

The wafer handler 9, of the central transport system 2, is comprised of a carriage 7 on which are mounted the main drive motor 25, a vernier or fine positioning motor 12, a coarse positioning potentiometer 115, a fine position sensor 120, a clutch brake 116, a Z-axis mechanism 117 for raising and lowering the wafer pickup chuck 8. Normally, the carriage will traverse the central transist rail 10 at each stopping address of the various processing sectors or stations. This establishes a final stopping point for the carriage 9 in conjunction with minimizing drift and calibration problems and eliminating any type of mechanical contact at the stopping address. A servo demodulator 122 is employed to convert the AC signal from the detector to DC for the use by the fine positioning or vernier motor 12.

The wafer handler 9 is controlled by a two-mode servo mechanism system. This servo mechanism system is shown schematically in FIG. 11. The high speed or coarse position mode utilizes a typical direct current servo with a potentiometer feedback. The low speed or fine position mode utilizes a modified DC servo with a non-contact position sensor 120 which detects a fixed segment on the rail 120 on the carriage 9, and one fixed actuating bar segment 121 at each pedestal location or stopping address of the various processing sectors or stations. Also included on the carriage are the two servo motors, e.g. the main motor drive 25 and the fine positioning or vernier motor 12, the coarse position potentiometer 115 and the Z-motion mechanism 117. Also included in the wafer carriage 9 is the gear end drive mechanism (see FIG. 10) which is associated as electro-mechanical clutch 123 and an electro-mechanical brake 116. The handler controller includes a servo amplifier 123, an address matrix 124 which serves as a digital to analog converter, a coarse position summing-amplifier 125, a fine position demodulator 122 which converts a signal from the fine position sensor from AC to DC; and also included are a pair of voltage comparators, in e.g. a coarse comparator 126 and a fine comparator 127 plus all required logic and power supplies to run the controller and the carriage.

Figure 11:
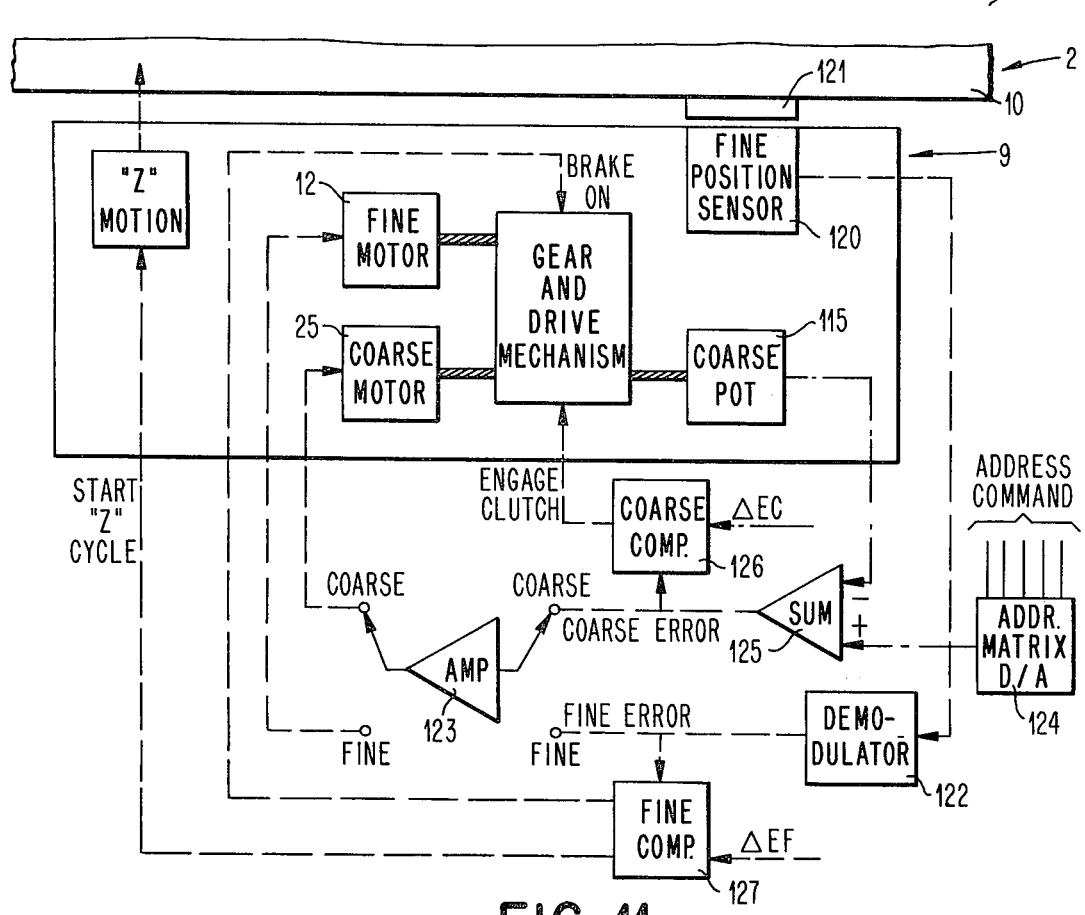
FIG. 11 is a schematic illustration of a control system for a transport system adapted for use in the manufacturing system of this invention.
Figure 12:
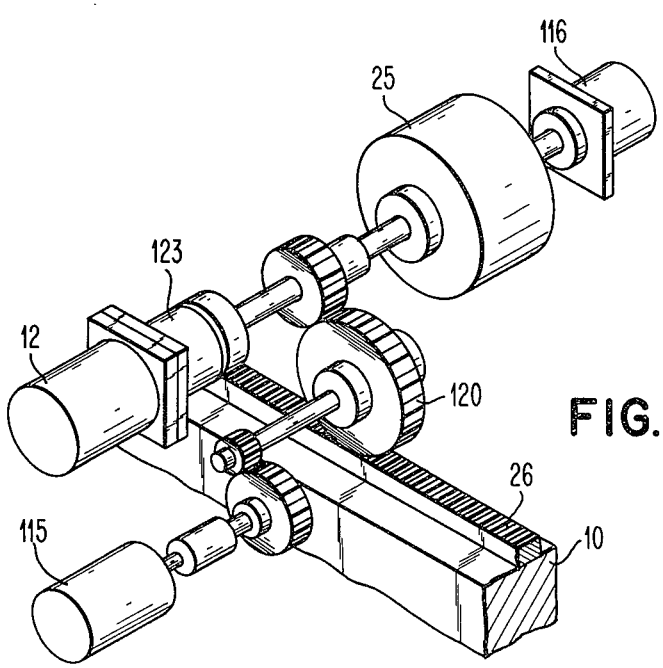
FIG. 12 is an exploded view illustrating details of a transport system shown in the proceeding figures.

With reference to FIG. 11, the operation of the system may be considered relative to the status of the system prior to making a move. At this point in time, the carriage 9 will normally be positioned over some input or output pedestal along the rail 10, the identification of which is of no moment for purposes of this consideration. At this time the brake 116 will be on, locking the carriage 9 to the rail 10. To initiate a movement to a different pedestal, a digital address is placed at the input of the address matrix 124. This generates a voltage or coarse address signal at the positive input of the coarse position summing amplifier 125. The current position of the carriage 9 is represented by the voltage from the coarse position potentiometer 115, which appears at the negative input of the summing amplifier 125 is a voltage which is proportional to the distance to be moved and of the proper polarity to drive the carriage 9 in the proper direction. At the outset, this error signal exceeds the magnitude of $\Delta$ EC, and the coarse comparator switches the control into the coarse mode. This "switch" connects the coarse error signal through the input of the servo amplifier 123 and connects the output of the servo amplifier 123 to the coarse drive motor 25.

Simultaneously, brake 116 and clutch 123 are released. The brake release allows the carriage 9 to move with respect to rail 10, and the clutch release disengages the fine or vernier motor 12, allowing the coarse motor 25 to drive the carriage. The acceleration of the carriage drive will be determined by the maximum output current of servo amplifier 123. The final running speed will be determined by the maximum output voltage of this servo amplifier. The gain of the servo amplifier will normally be set sufficiently high so that the amplifier operates at in either voltage or current limit until the carriage 9 has traveled to the approximate position of its stopping address. When this point is reached, the value of the coarse error signal will be low enough to allow the servo amplifier 123 to operate in its linear region. Since the mass of the carriage 9 will be quite large and the rolling friction small, braking will be required to decelerate it within the remaining distance of travel. This is done electrically by the servo amplifier 123. As the carriage 9 approaches its stopping address, the output voltage of the servo amplifier 123 will decrease faster than the back EMF of the coarse motor 25. This will cause the current to reverse direction and consequently, the torque also at the shaft of the motor. The amount or reverse current is limited by the amplifier and hence the rate of the decleration is limited.

As the carriage 9 moves towards the stopping address, the coarse error signal decreases proportionately until it is less than $\Delta$ EC. The coarse comparator 126 detects this level and switches to the fine positioning mode. Normally, the compare level, $\Delta$ EC will be selected so that the carriage will have entered the range of the fine positioning sensor 120. The switch to the fine mode includes switching the output of the servo amplifier 123 from the coarse potentiometer 115 to the demodulator 122. The carriage 9 will now be driven by the fine positioning motor 12 towards the null position of the fine position sensor 120. This null position will be sensed at the output of the demodulator by a second comparator 127. When this output becomes less than $\Delta$ EF, the carriage 9 will have been driven within the required tolerance of the stopping address, and the comparator 127 will switch to the stop mode. This switch includes turning on the brake 116 to lock the carriage 9 in the position on rail 10, and sending a pulse to the "Z-axis" motion mechanism to either pick up or put down a part which may be carried on the chuck 8. Then the "Z" motion is completed, a switch closure on the mechanism will signal the control unit that the carriage move has been completed.

As indicated above, the Z-motion mechanism 117 is employed to load/unload work-pieces to and from input/output pedestals on the various processing sectors or stations, see. 1A to 1F.

After the work handler or carriage 9 is positioned over the appropriate input/output station, it is ready to start its load/unload cycle. When a work-piece is in the holder, it will be unloaded onto an input or load pedestal of the next specified processing sector or station;

and when the carrier is not transporting a work-piece, it will be directed to output pedestal of a sector, and work-piece at that point will be picked up by the handler to be transferred to another processing sector or station. When the carriage is positioned and stationary at its specified address, the loading/unloading cycle is started by command to drive motor 143 which is connected to a one revolution clutch 142. The Z-motion mechanism is actuated during one revolution of the output shaft of drive motor 142 through a gear set 147 serving as an input to the cam index 147A which will revolve twice during the cycle as a result of the two to one ratio of gearing set 147. The output crank 148 will make an up and down motion with appropriate dwell on the bottom of the stroke, and since the crank 148 is attached in slot 150 of slide block 151, the wafer chuck will be moved up and down on slide rods 149 so to place or remove a work-piece from the input or output pedestal station.

Figures 13, 14:
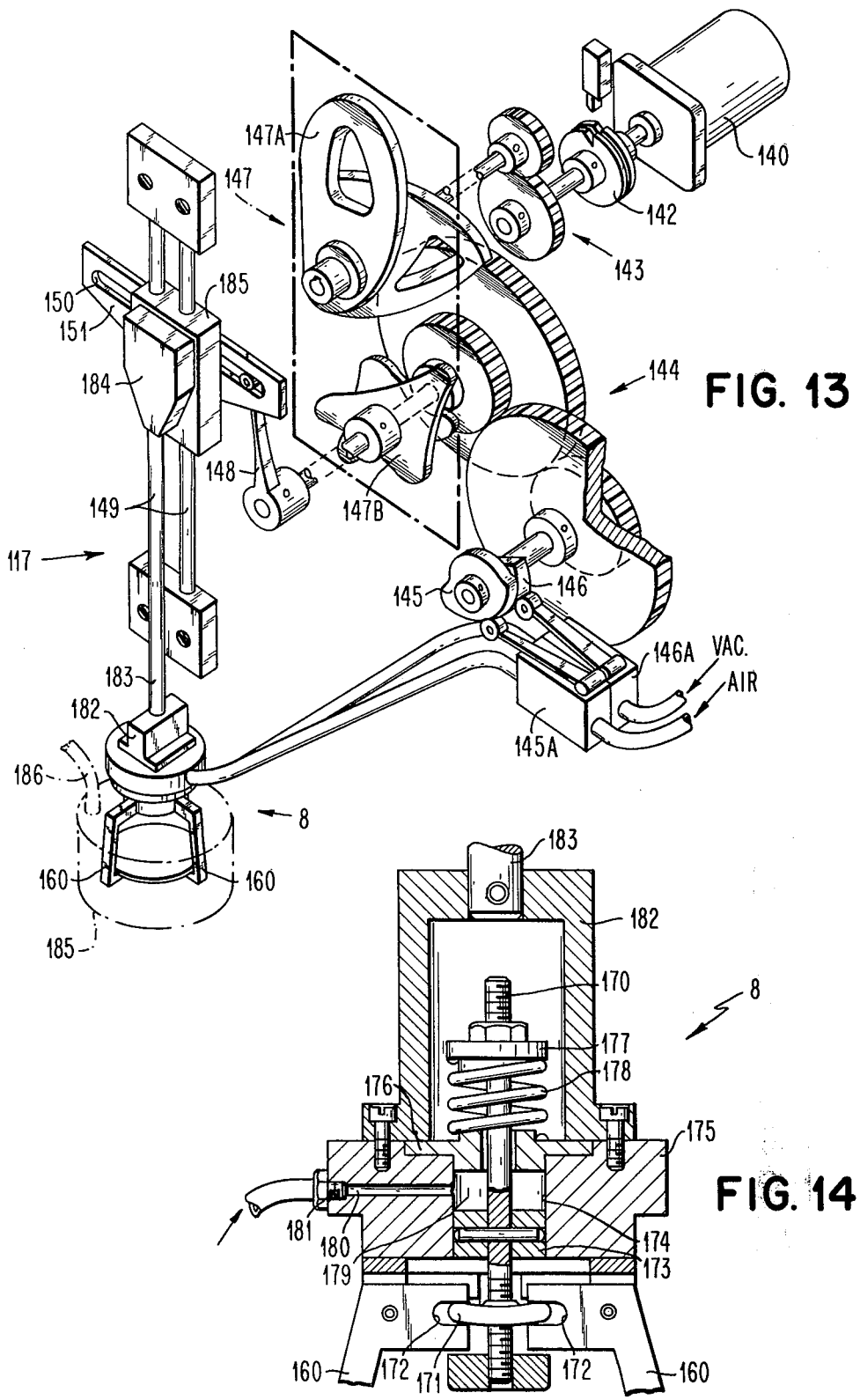
FIG. 13 is an exploded view illustrating details of a portion of a transport system to be employed for transfer of wafers between various semiconductor processing sectors.
FIG. 14 is an elevational view partly in section illustrating details of a wafer carrier incorporated in the proceeding figures.

Meanwhile during the up and down stroke, holder fingers 160 (see FIG. 13) are actuated to open or to close position as the case might be. Concurrently, the cams 145 and 146 make only one half of a revolution during the cycle due to a one to two ratio of gear set 144. Thus, the fingers 160 on holder or chuck 8 are opened or closed during the cycle. The timing of cams 145 and 146 will be such that the finger actuation is behind the down movement at the extreme bottom portion of the slide 150 to give time delay for actuation of the fingers 160 during the dwell of the indexer.

Actuation of the fingers 160 is effected by means of a cam rod 170 having an enlarged drive shoulder section 171 mounted within slots 172 of fingers 160 which will as a result, be forced open and closed by movement of the cam rod 170 up and down. Secured about cam rod 170 is a piston 173 which will travel up and down within a bore 174 of a cylinder block 175. The upper portion of the cylinder block is provided with a cylinder head 176 having a bore for reciprocation of the cam rod 170 therethrough. Secured at an upper portion of cam rod 170 is a retaining 177 flange for a return spring 178 contained against the cylinder head 176. An inlet for gas pressure into the cylinder space 179 is formed by a bore 180 whose outlet 181 is connected to a suitable source of gas pressure. Mounted on the cylinder block 175 is a bracket 182 having on which is an extending secured mounting rod 183 attached at its other end to a plate 184 which in turn is mounted to a slide block 185. If desired, a work-piece (such as a wafer) can be further supported on the inwardly extending portions of fingers 160 by provision of vacuum holes into each holder finger. Actuation of vacuum to the fingers and camming the fingers opened and closed is by means of cams 145 and 146 which suitably activates fluid valves 145A and 146A. The camming indexer 147 will comprise an indexer input 147A and an indexer output 147B. Also, in the preferred mode the chuck 8 will include an environmental enclosure or cover 185 through which an environmental atmosphere can be injected via hose 186.

Normally, a plant erected to incorporate the manufacturing system of this mention will be under computer control, and be incorporated in the basic control system unit 112 of FIG. 9. In such an environment, any associated memory of the computer, e.g. tape or disc, may have entered into it a plurality of part programs consisting of a series of instructions specifying the required operations for a work-piece, together with the necessary process parameters within each processing sector as well as means for self-adaptive automatic processing within the sector or between processing sectors. In conjunction with specifying the required sequence of processing operations to be performed, the program will also specify a corresponding preselection of the sequence of process sectors through which a work-piece must be processed to effect its desired total processing. Each part program will be identified by a part number, or other suitable codes which uniquely associates the series of operation to be performed with the particular part on which the operations are to be performed. In addition, the control system will include provision for the storage of additional part programs for a new part number, or modification of existing part programs as required for existing part numbers.

To initiate operation, the control system is informed e.g. by an operator at a console or terminal, of the part number to be processed, whereby the file of the computer memory will be searched for the part program, associated with the part number, for transmittal to the control system. After the transmittal of the part program to the control system, the functional units of each processing sector will be activated to the status required for processing of the work-piece. In conjunction with the main control system, each sector can be provided with its own individual control for setting process parameters and for wafer flow within the sector. A sector may be operated such that one can present a wafer at the input pedestal, and it will be processed through to the output pedestal, the sector controls providing for routing of the wafer through the process steps in that sector, as well as control of parameters within the sector, as for example, temperature, gas flows, etc. such as employed for semiconductor processing.

Each sector control system can communicate with the main control system, which can monitor sector-to-sector workpiece flow, provide adapted control functions, and record required parametric data. In addition, the main control unit can communicate with those factory systems which support the functions of production control design and process automation, quality testing, etc.

The control of process parameters, e.g. temperatures, flows, etc., can be accomplished by standard analog or digital means. Selection of the particular method of control will normally be made on a basis of precision, reliability, cost, compatibility with the unit being controlled and other standard engineering considerations. In some cases it may be desirable to have the main control system set the parameter levels. For example, in a semiconductor processing system, the setting of an etch time can be made a function of the thickness of material measured in the previous sector on the wafer. Override motor control may also be provided for parameter setting by the main control unit in such cases. In the absence of a signal from the main control unit, the local control (e.g. each sector) must refer to its nominal set point or remain at the set point indicated by the last available main control unit signal, whichever is appropriate for the particular parameter of interest.

Monitoring the functions are also comprehended to insure that equipment failure will not result in catastrophic mishap and also to insure that the process is in control and product is made within allowable specification. The monitoring of process parameters can be done by the main control unit, using redudant sensing elements built into each sector, such that the same sensor will not be used for control of the parameter and for monitoring the parameter. Also, the main control unit can compare critical parameter values against predetermined limits and when required, take appropriate action in accordance with techniques well known in the art for notifying maintenance and inhibiting further entry of work-pieces to that sector.

At critical work-piece transfer points within a sector, a signal can be generated for the main control unit to enable it to monitor progress of work-pieces through the sector and to track individual work-pieces for part number control and for correlation of parameter and measurement data with individual work-piece final test results.

As indicated above, among the important functions of such a control unit is for logistic control of work-pieces through the various sectors of the overall manufacturing system, e.g. specifying the manner in which the work-pieces are indexed through a specified sequence of selected processing sectors. A preferred approach for such logistic control of prescribed sequencing of work-pieces through the sectors is that disclosed and described in copending application U.S. Ser. No. 329,494 filed Feb. 5, 1973 (IBM Docket FI9-71-135), also assigned to the assignee of this application. The invention disclosed in this copending application comprehends various modes of operating the manufacturing system of the invention described in the instant application.

In all modes of sequencing a work-piece, the logic of the control system is based on a fixed routing of the workpiece through all processing sectors for each part number of the work-piece involved. Also, the logic of the movement of work-pieces between sectors is based on knowing the status of the input and output pedestals or positions of each processing sector. Therefore, the logic depends on an "output pedestal status" indicator for each of these sectors. Also, the logic requires a "transport system status" indicator to reflect the unit's availability for movement of the work-pieces through the various processing sectors. Thus, the logic of the various modes of sequencing wafers is based on a continuous polling of the indicators, e.g. input and output status indicators, in such a way as to meet an objective of trying to keep each processing sector's input pedestal occupied by a wafer.

Figure 15:
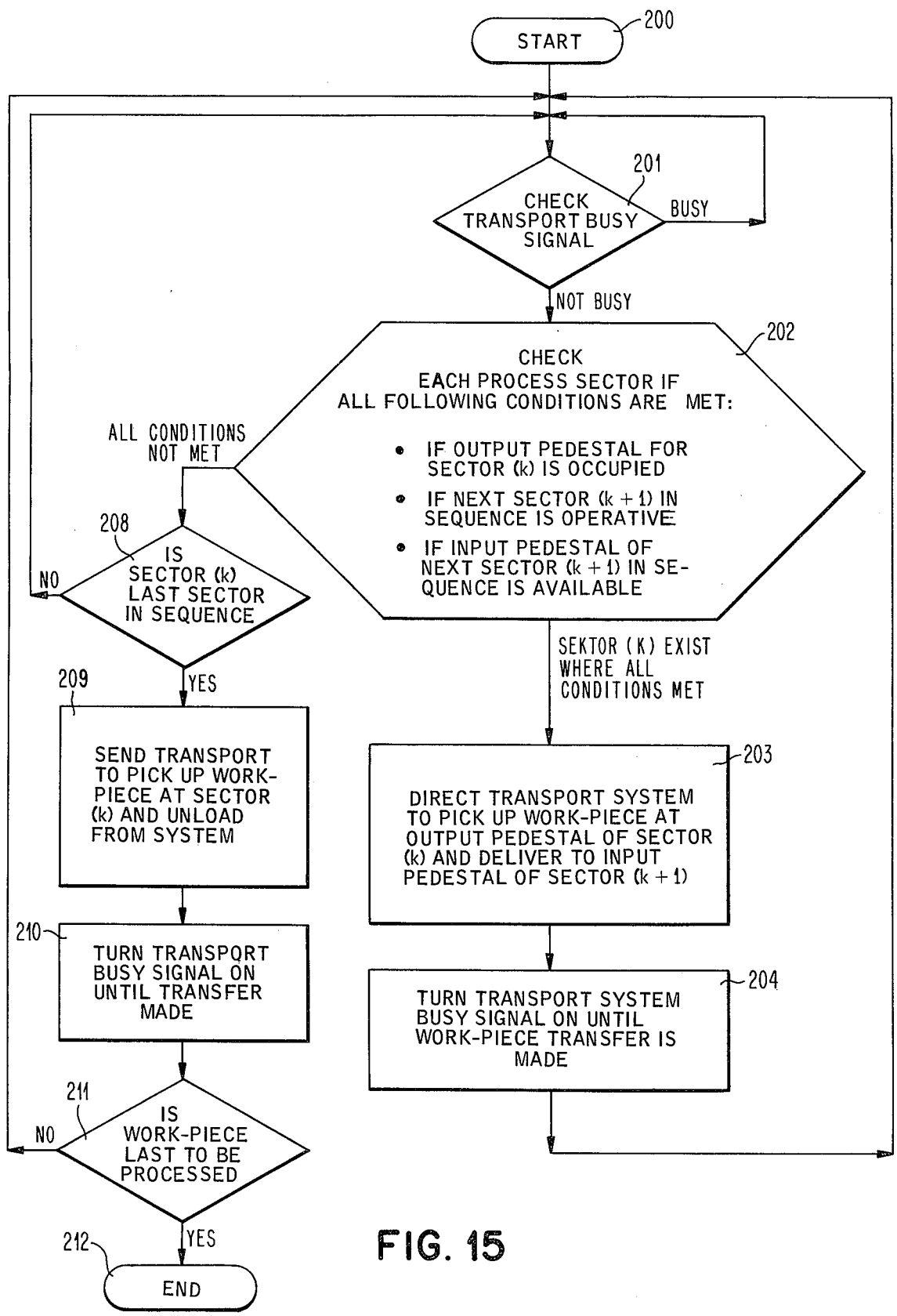
FIGS. 15 to 18 illustrate steps of control systems for various operating modes employed in the manufacturing system of this invention.

The first mode comprehended in the aforesaid copending application U.S. Ser. No. 329,494 (IBM Docket FI9-71-135) relates to the sequencing of work-pieces through a preselected sequence of processing sectors all of which are dedicated to a specific portion of the overall process, and where an individual work-piece will only visit such a sector only one time. FIG. 15 illustrates an outline of steps present in this mode of operation. Referring to FIG. 15, the first START step 200 is employed to initiate the control system for sequencing the work-pieces through the processing sectors. On initiation, the system proceeds to Step 201 to determine if the transport system 2 is presently in the process of transferring a work-piece between sectors. If a positive determination is made to the effect that transport system is at that time transporting a work-piece, the determination of Step 201 is repeated as necessary until the transport unit is found to be free.

If the transport system is found to be available, the control system will proceed to Step 202 for successively checking each of the procesing sectors until a sector is found meeting all three of the following conditions:

1. if the output position pedestal for a sector (K) being checked is occupied by a work-piece;
2. if the next succeeding sector (K+1) in the prescribed sequence of sectors is operative; and
3. if the input pedestal of this next sector (K+1) in the sequence is available If a negative determination is found for any one of the three forgoing conditions (e.g. all conditions not met) at all sectors, the system at the last sector $(K + n)$ will proceed to Step 208 to determine if the output or unload pedestal of this last sector $(K + n)$ is occupied by a finished work-piece. On a negative determination in Step 208, the system will return to Step 201.

Conversely, if the determination of Step 208 is positive, indicating that the output position of the last sector $(k + n)$ is occupied by a finished work-piece which can be unloaded out of the processing line, the control system as indicated in Step 209, will dispatch the transport system to output pedestal of the last sector $(K+n)$ to pick up the work-piece and to unload it from the system, while concurrently as Step 210 turning on the transport units busy indicating until the move is made. On completion of the move, the system will proceed to Step 211 to determine if the last scheduled work-piece has been proceeded e.g. no further work-pieces are to be processed. On a positive determination, the system will proceed to stop Step 212 to terminate further operation of the contol system; and if a negative determination is made, the control system will return to Step 201.

If a sector (K) is found which first meets all of the conditions specified in Step 202, the system proceeds to Step 203 where the transport system is directed to pick up a work-piece at the output pedestal of the sector (E) and to deliver it to the input pedestal of next processing sector (K+1) of the prescribed sequence of sectors. Concurrently, as indicated in Step 204, turn the transport system busy signal on, which signal will be maintained until the work-piece transfer is made between the indicated processing sectors. On completion of the transfer, the transport busy signal will be turned off, with the control system proceeding to Step 201 for repeating the determination therein.

Figure 16B:
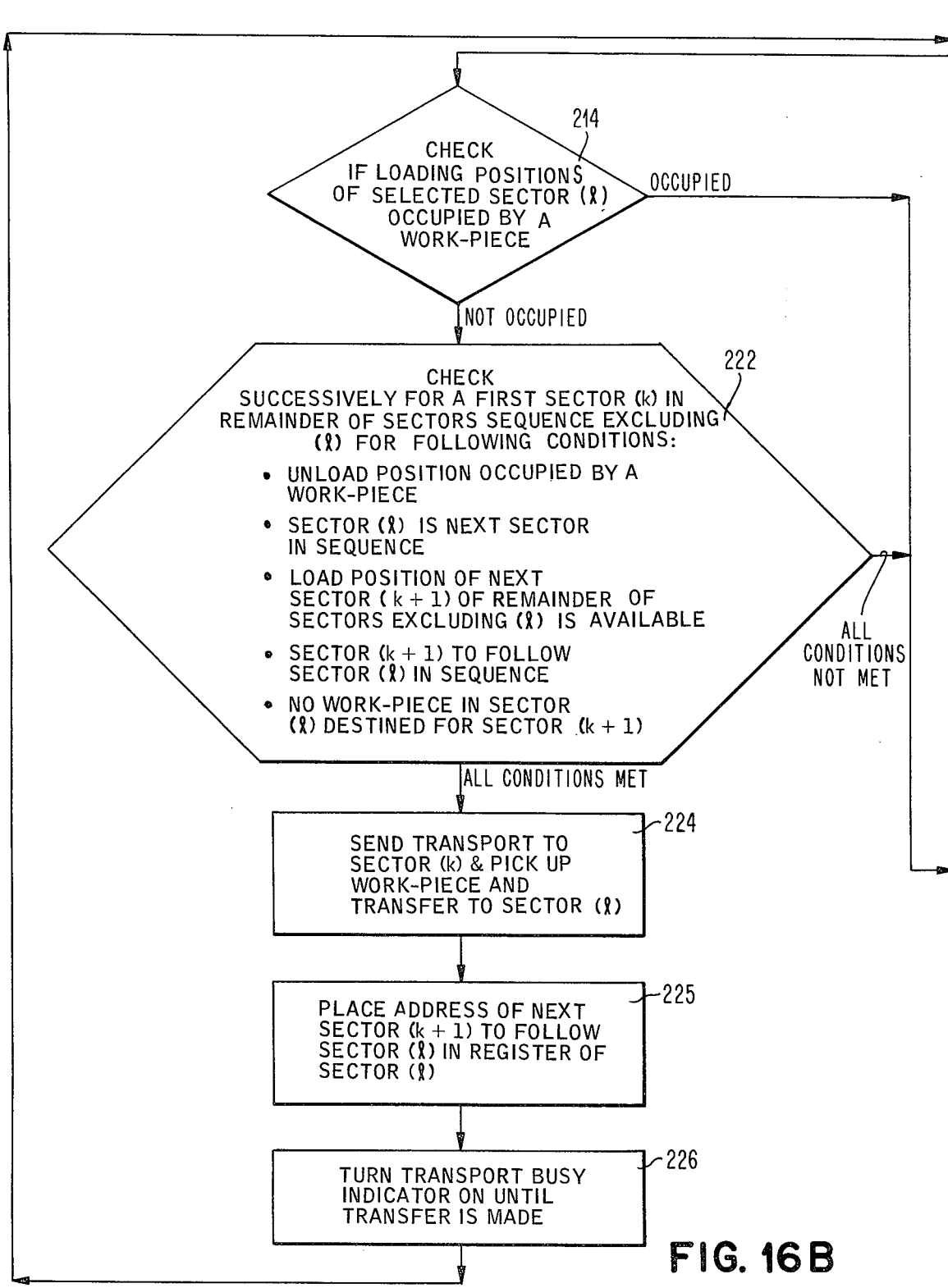
Figure 16C:
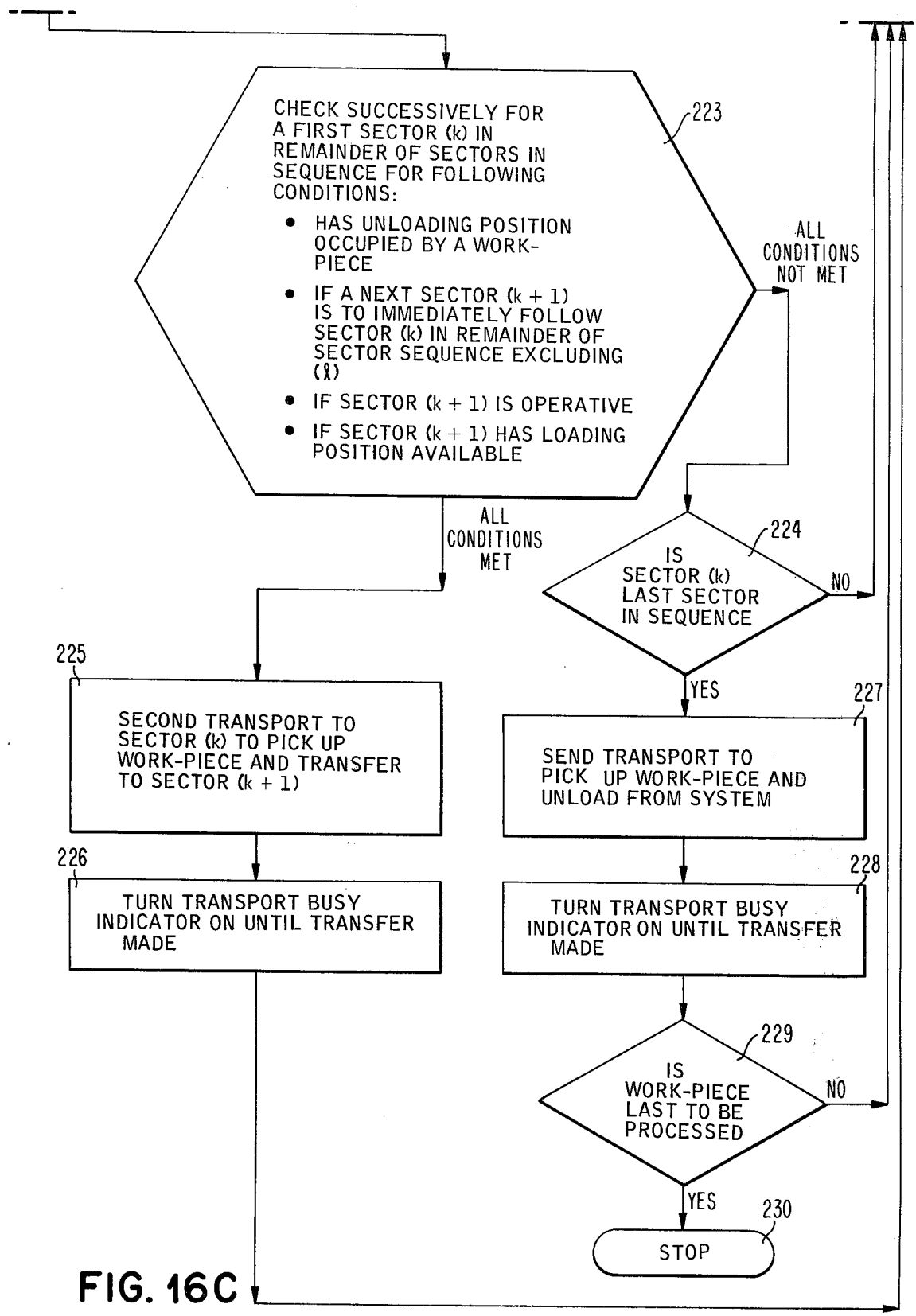

A second mode of operation comprehended in the said copending application U.S. Ser. No. 329,494 (IBM Docket FI9-71-135) is directed to the transfer of a work-piece to a plurality of processing sectors wherein is included selected procesing sectors (L) to which the work-piece is transferred at least twice either prior to transfer to another of the remaining processing sectors K+(e.g. $K$, $K$+1 . . . $K$+$n$) or after leaving any of the other remaining processing sectors $K_x$. In this mode of operation as illustrated in FIG. 16, the control system begins with a START Step 205 to initiate operation.

On initiation of the control system, it precedes to Step 206 to check the transport busy signal, of its indicator, to see if the transport is presently transporting a work-piece between any of the processing sectors. If the transport unit is presently transporting a work-piece, the determination of Step 206 is repeated until the transport unit is found to be available for transferring another work-piece, at which time it will proceed to Step 207. In Step 207 a check is made to determine if a work-piece is occupying an output position of any selected sector (L) which is utilized twice for processing a work-piece therethrough in a prescribed sequence of operations. If an output station of a selected sector (L) is found occupied by a work-piece, the system proceeds to Step 213. However, if no output stations of a selected sector (L) is occupied by a work-piece, the system proceeds to Step 214.

If a determination is made in Step 213 that the sector (L) is the last sector in the sequence required to process a work-piece, the system will proceed to Step 215 wherein the transport system is directed to the selected sector (L) to pick up the work-piece and to unload it from the system, while concurrently as indicated by Step 216, turning the transport system busy signal on until the transfer is made to unload the work-piece from the processing system. A subsequent Step 217 a determination is made to find if the work-piece being transferred is the last of a scheduled series to be processed. On a positive determination, the system proceeds to stop Step 218 which terminates operation of the control system. However, if the determination of Step 217 is negative indicating that additional work-pieces are to be processed, the system returns to Step 206 to repeat the indicated determination thereof.

If the determination in Step 213 shows that the selected sector (L) is not the last sector in a specified sequence of processing sectors, the system moves to Step 219 to make determination if the input position is available in the next sector (L+1), which can include a sector $K_x$, whose address specified is in a destination register of the selected sector (L). If the determination is negative, the system will proceed to Step 214 which, as previously indicated, is also responsive to Step 207. Conversely, if the determination in Step 219 indicates that an input of load position is available in the next sector (L+1) whose address is specified in the deestination register of the selected sector whereby the transport is directed to make the the transfer. Concurrently, as indicated in Step 221, the transport system's busy indicator will be turned on and maintained on until the transfer is made whereupon, the system returns to Step 206 for repeating the determination therein.

In Step 214 (responding to the determinations of both Steps 207 and 219), a determination is made if a selected sector (L) has a loading or input position occupied by a work-piece. On a negative determination indicating that the loading position is not occupied, the system proceeds to Step 222, and conversely, on a positive finding that the loading position of a selected sector (L) is occupied by a work-piece, the system moves to Step 223.

In Step 222, each of the remaining sectors (in a prescribed sequence of sectors but excluding any selected sector (L) are checked to find a first sector (K) meeting all of a plurality of conditions, to wit. Specifically, the first of the conditions is to determine if a processing sector (K) has its unload or output position occupied by a work-piece. Secondly, a determination is made if a selected sector (L) is to be the next sector to follow sector (K) in the prescribed sequence of processing sectors. The third condition determined is whether the load or input position of the next sector (K+1) (of the remainder of sectors in the sequence excluding the selected sector (L), is available. The fourth condition determination is whether the sector (K+1) is to follow a selected sector (L) in the sequence and finally, the fifth condition determined is whether there is no work-piece in a selected sector (L) destined for sector (K+1). For this fifth condition, a positive determination is made on a finding that yes there is no work-piece in the indicated selected sector (L). If all conditions of the determination of Step 222 are not met, the control system proceeds to Step 223, which as above indicated is also responsive to the determination of Step 214. If all the conditions of Step 222 are met, the control system proceeds to Step 224 which will direct the transport system to proceed to the sector (K) where it will pick up a work-piece from its unload position and transfer it to the loading position of a selected sector (L). Concurrently, in Step 225 an address is placed in the destination register of the selected sector (L) indicating that sector (K+1) is to follow it in the sequence of processing sectors. Also, as indicated in Step 226 the transport busy signal indicator will be turned on and maintained on until the indicated transfer of the work-pieces is made, whereupon the control system will return to Step 206 repeating the determination of this step.

In Step 223, a check is made of successive processing sector $K_x$ excluding the selected sectors (L) to find a first sector (K) which first meets all of the four following conditions. The first condition to be met is whether a processing sector (K) has an unloading or output position occupied by a work-piece. A second condition is a determination of the existence of a succeeding sector (K+1) to immediately follow the sector (K) in the sector sequence. The third condition is a determination if the next sector (K+1) is operative, and whether the sector (K+1) has a loading or input position available to receive a work-piece. If no processing sector (K) is found meeting all conditions, the control system proceeds to Step 224. Conversely, on finding of a processing sector (K) first meeting all conditons specified in Step 223, the ocntrol system proceeds to Step 225 which directs the transport system to proceed to the unloading position of the sector (K) to pick up a work-piece and transfer it to the loading position of the sector (k+1). Concurrently, as indicated in Step 226, the control system will have its busy indicator turned on in which condition it will be maintained until the transfer of the work-piece. Upon completion of the transfer, the contol system will return to Step 206 for repeating the determination therein.

AS indicated above, if the determination of Step 223 indicates the absence of any processing sector (K) meeting the conditions specified in the control system will then proceed to Step 224 which determines whether any processing sector (K), excluding any selected sector (L), is the last sector in the prescribed sequence of processing sectors. If the determination is negative, the control system will return to Step 206 for repeating the determination therein. Conversely, if the determination is positive, the control system will proceed to Step 227 which will direct the transport system to proceed to the output station of the processing sector (K) for purposes of unloading the work-piece from the manufacturing system, while Concurrently, turning on the busy indicator of the transport system, which condition will be maintained until the transfer is made, as indicated in Step 228. In the next operation, the control system proceeds to Step 229 for purposes of determining if the work-piece transferred is the last of a series to be processed. If the determination is negative, the control system returns to Step 206 for again repeating the determination therein, while, conversely, if the determination is positive, indicating that the work-piece is the final one of a series to be processed.

The control system proceeds to Step 230 to suspend the operation of the control system.

Figure 17B:
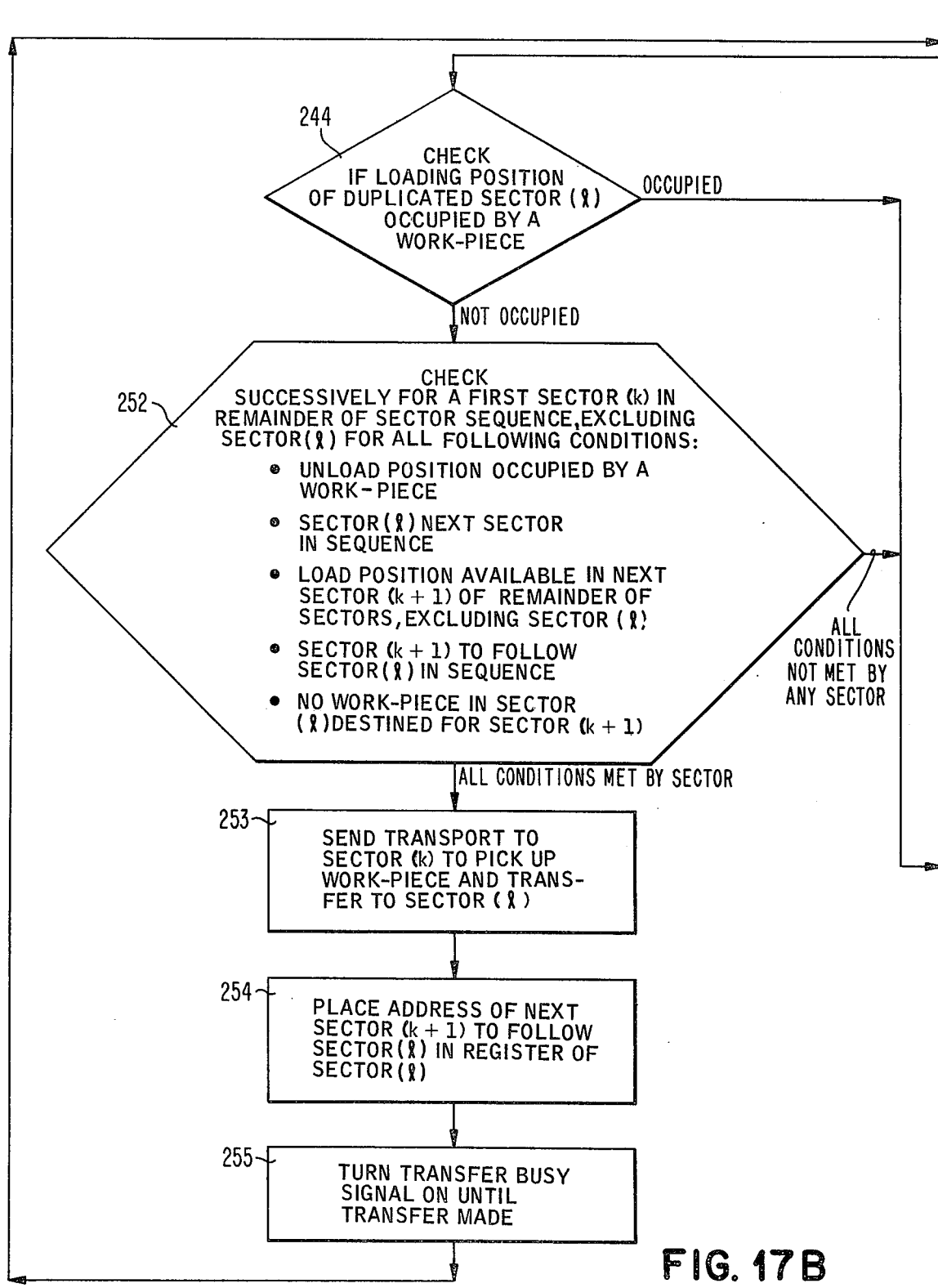
Figure 17C:
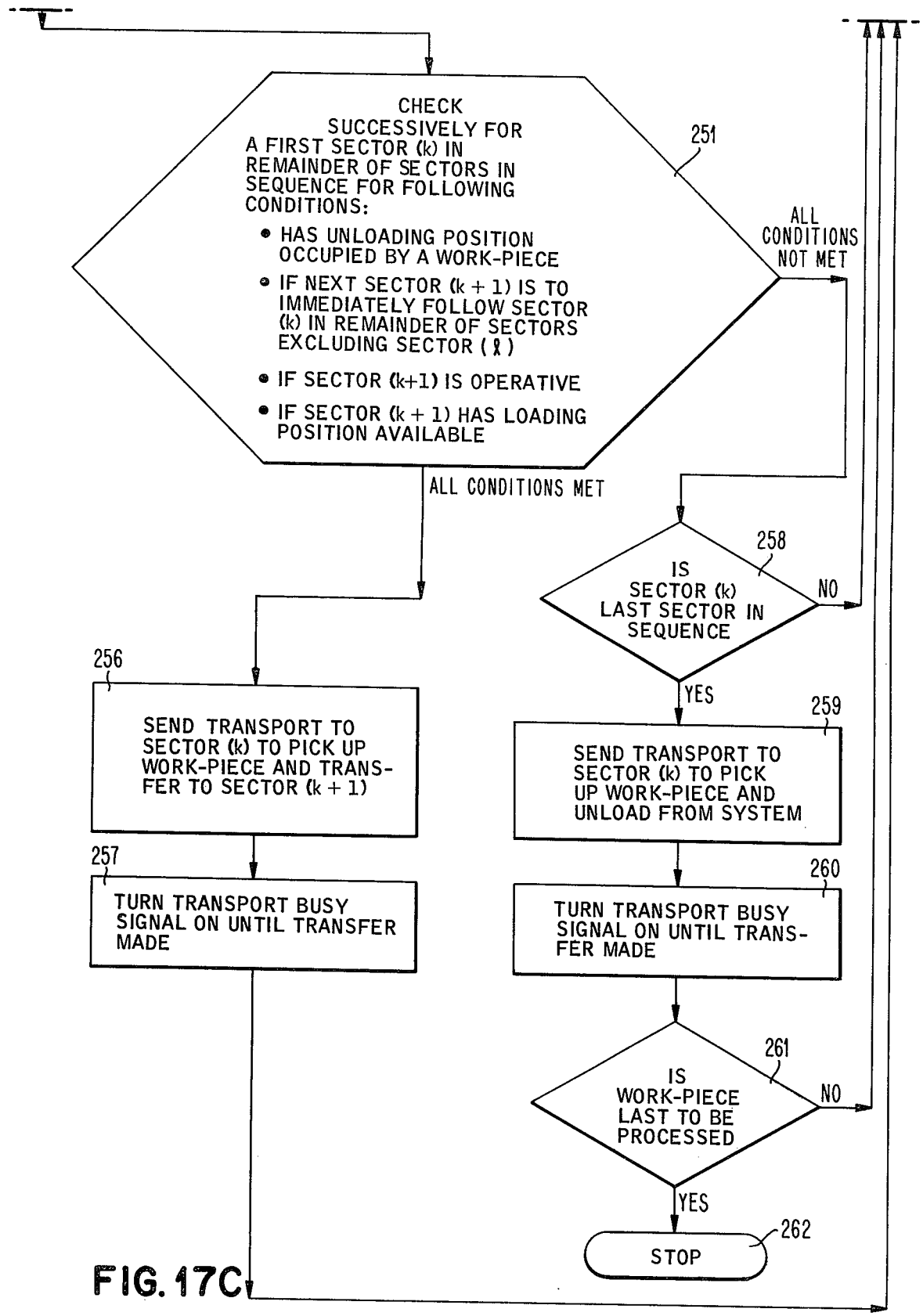

FIG. 17 illustrates a control system for use with the manufacturing system of this invention when at least two of the processing sectors are duplicated to have substantially similar operations, as exemplified by the use of the two photoresist pattern generator units 6 in FIG. 1 when the system is adapted for processing of semiconductor devices. In this mode of operation, the system is initiated at Step 240 which begins operation. When the system is initiated, it proceeds to Step 241 to determine if transport system is busy supporting a wafer in transfer between processing sectors. If the transport system is found busy, the Step 241 is iterated until the transport system is found to be available, at which time the operation proceeds to Step 242. In Step 242 a check is made of the output positions of the duplicated sectors (L) until a first work-piece present signal is found or until all duplicated sectors have been checked. If an output position of a duplicated sector (L) is found occupied by a work-piece, the operation of control system will proceed to Step 243. Conversely, if none of the output positions of the duplicated sectors is found occupied by a work-piece, the control system will proceed to Step 244.

In Step 243, a determination is made whether any of the duplicated sectors (L) is the last sector in a prescribed sector sequence. If a determination is made that a duplicated sector (L) is the last sector of the sequence, the system will proceed to Step 245, whereas if it is found that no duplicated sector (L) is the last sector in the sequence, the control system will proceed to Step 246. In response to a finding in Step 243 that a duplicated sector (L) is the last sector in a sequence of processing operations, Step 245 will direct the transport system to proceed to the duplicated sector (L) in point to pick up the work-piece and proceed to unload it from the system, while concurrently, in Step 247 turning on the transport busy signal indicator in which condition it will be maintained until the worK-piece is unloaded from the system. On completion of the operation of Step 247, the control system will proceed to Step 248 where a determination is made as to whether the work-piece unloaded is the last one of a scheduled series to be processed through the various processing sectors. If the determination of Step 248 is positive, the system will proceed to Step 249 to terminate operation of the control system. Conversely, if the finding of Step 248 is negative, the control system will return to Step 241 for repeating the determination specified in this operation.

As indicated above, if the determination of Step 243 is that the duplicated sector (L) is not the last sector in the sequence, Step 246 will make a determination if an input or load position is available in a processing sector (L+1) which is to follow the operation in a duplicated sector (L) in the specified sequence of processing sectors. Normally, each duplicated sector (L) will have a destination register associated with it in which the address of the next processing sector (L+1), in the sequence of processing sectors, will be placed.

If a negative determination is made in Step 246 indicating that the input position of the following sector (L+1) is not available, the control system will proceed to Step 244, which as indicated above is also responsive to a negative determination made in Step 242. On a positive determination Step 246, that an input position is available in the following sector (L+1) of the prescribed sequence of processing sectors, the control system will proceed to Step 250 wherein the transport system will be directed to pick up a work-piece, at the output position of the duplicated sector (L) and to drop it off at the input position of the following sector (L+1) whose address is specified by the contents of the duplicated sector (L)'s destination register. Concurrently, Step 251 will direct the transport system to have its busy indicator turned on which condition will be maintained until transfer of the work-piece is made, following which, the control system will return to Step 241 for repeating the determination indicated therefore.

On a finding in Step 242 that no output or unload position of a duplicated sector (L) is occupied by a work-piece for transfer, or if occupied by a work-piece that no transfer is possible as determined in Step 246, the control system will proceed to Step 244 where a determination is made if an input or loading position of a duplicated sector (L) is occupied by a work-piece, the control system will proceed to Step 251. However, if a negative determination is made in Step 244, that an output position of a selected sector (L) is available, the control system will proceed to Step 252.

When an input position of a duplicated sector (L) is found, in Step 244, to be available to receive a work-piece a determination is made in Step 252 at successive ones of each of the remaining sectors, excluding duplicated sectors, to find a first of these sectors (K) which meets each of five conditions. The first of these conditions is whether the sector (K) has an output or unload position occupied by a work-piece for transfer to another sector. The second condition is whether one of the duplicated sectors (L) is to be the next sector specified in the prescribed sequence of processing operatons, and whether an input or load position of a next sector (K+1) of the remainder of sectors in a sequence (excluding the duplicated sectors) is available to receive a work-piece, and whether the sector (K+1) is to follow a duplicated sector (L) in the prescrribed sequence of processing operation. In addition a determination is also made as to the absence of a work-piece in a duplicated sector (L) destined for trnasfer to the sector (K+1). If no processing sector excluding the duplicated sectors, is found meeting any of the conditions specified in the Step 252, the control system will proceed to Step 253, which directs a transport system to the processing sector (K) to pick up the work-piece at the output or unload position thereof and transfer it to a duplicate sector (L), while at the same time, by Step 254, placing the address of the next sector (K+1) which is to follow the sector (L) in the destination register thereof. Concurrently, by Step 255, the transport busy indicator signal will be turned on and maintained in this condition until the indicated transfer of the work-piece is made, whereupon the control system will return to Step 241 to repeat the determination specified therefore. On a positive determination of Step 244, and a negative determination of Step 252, the control system, as indicated above, will proceed to Step 251.

In Step 251 each of the remainder of processing sector (K) excluding the duplicated sectors, of the specified sequence of processing sectors, will be checked to find a first sector (K) meeting each of four conditions. The first condition is whether a sector (K) has an output or unloading position occupied by a work-piece for transfer to another sector. Also, whether the next sector (K+1) is to immediately follow the sector (K). Another condition is whether the following sector (K+1) is operative, and finally, whether the next sector (K+1) to follow sector (K) has an input or loading position available to receive a work-piece. If no sector is found meeting all the conditions specified in Step 251, the control system will proceed to Step 258. However, when the first sector (K) is found meeting all conditions specified in Step 251, the control system will proceed to Step 256 where the transport system will be dispatched to the output position of processing sector (K) where it will pick up the work-piece and transfer it to the input position of the folowing sector (K+1), while concurrently turning on, in Step 257, the transport busy signal until the indicator transfer of the work-piece is made, after which the control system will return to Step 241 to again renew the determination specified therefore.

In Step 258, in response to a determination that no processing sector (excluding the duplicated sectors) in the prescribed sequence of sectors meets all the conditions specified in Step 251, a determination is made to whether any sector (K) is the last sector specified in the sequence of processing operations. On a negative determination in Step 258, the control system will return to Step 241, whereas on a positive determination a Step 258, the control system will proceed to Step 259 wherein the transport system will be directed to the output or unloading position of the sector (K) in order to pick up the work-piece and to unload from the system, while at the same time turning on the transport proceeding indicator signal until the work-piece is unloaded from the system, as indicated in the Step 260, the control system will again return to Step 241 to repeat its determination. On a positive determination in Step 261 that the work-piece is in fact the last of the series scheduled to be processed, the control system will proceed to Step 262 which will terminate operation of the control system.

Figure 18B:
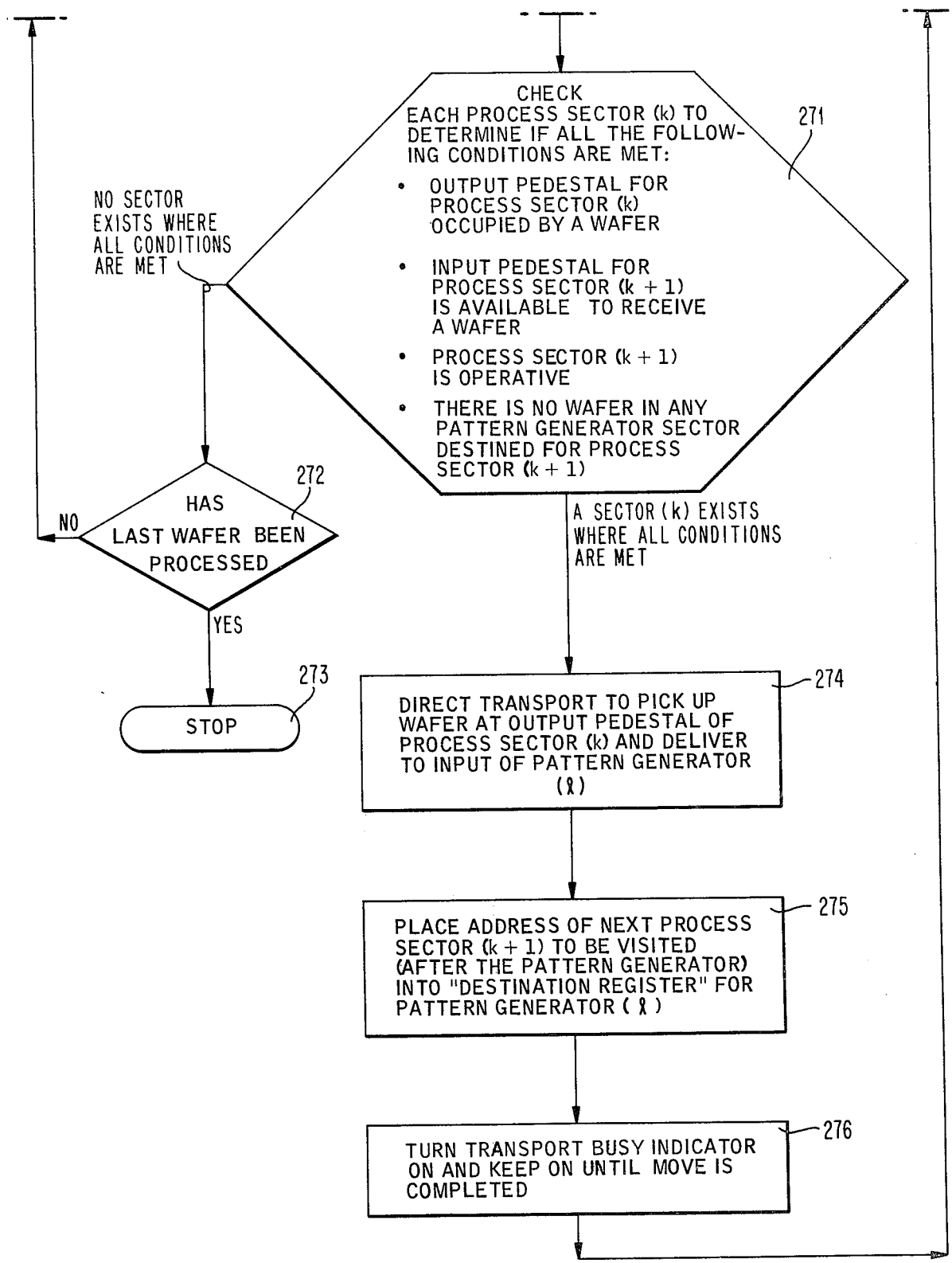

FIG. 18 illustrates the adaptation of the control system of FIG. 17 to the processing of the above indicated field effect transistor devices as applied to FIG. 1. As previously noted, such a field effect transistor manufacturing system will comprise, with reference to FIG. 1, and oxidation sector 1A, a source and drain fabricating sector 1B, a gate oxidation sector 1C, two pattern generating units 6 as grouped within a resist exposure sector 1D, a metallization sector 1E, and a sintering sector 1F. For purposes of illustration, the various processing sectors will be classified into two categories. In the first category will be the first group of sectors referred to as pattern generating sectors (e.g. pattern generating unit 6) which will be re-visited by semiconductor wafers after the wafers leave the other remainder of the processing sectors. The general term "processing sectors" will be applied to the remainder of the sectors, excluding the pattern generating sectors. Thus, for the purpose of this explanation, the manufacturing system will contain processing sectors, e.g. 1A, 1B, 1C, 1E, and 1F and also, pattern generating sectors as represented by pattern generating units 6. In operation, a fixed routing will exist (e.g. all wafers to follow the same path through all sectors) with the routing alternating between visits to a processing sector and to a pattern generating sector. In addition, as indicated previously, each of the various sector times will have an input pedestal and an output pedestal.

The logic of moving wafers between the various sectors is based on knowing the status of these input and output pedestals, and in the special case of delivering of a wafer to a pattern generating unit 6, remembering what sector that wafer is destined for upon exit of the pattern generating units. Therefore, the logic of the control system depends upon an "output pedestal status" indicator for each sector and an "input pedestal status" indicator for each sector. Additionally, a "pattern generator destination register" is maintained which represents the address of the sector to which a wafer must be sent upon exiting from a specific pattern generator unit 6. Also, a transport indicator is maintained to reflect the availability of the transport to do work. The logic of the control system of FIG. 18 is based on a continuous polling of the indicators mentioned above in such a way that an objective of trying to keep each of the various sectors input pedestal occupied by a wafer will be met. The strategy of control system is based on a continuous polling of the transport systems busy indicator until a "not busy" signal is found. Also, the first priority move of this system is to exit wafers from a pattern generator unit 6 following which the system will look for other moves for the wafers.

Initiation of the control system begins in START Step 265, following which the system proceeds to Step 266 is repeated until the transport system is found available whereupon the control system will proceed to Step 267.

In Step 267, a check is made of the output pedestal status indicator of each of the pattern generating units 6 in turn until a "wafer present" indication is found. If the determination in Step 267 indicates that no output position of pattern generator unit 6 is occupied by a wafer, the control system will proceed to Step 268. Conversely, if the determination of Step 267 shows that a wafer is present at an output pedestal of a pattern generating unit 6, then the control system will proceed to Step 269 wherein the transport system will be directed to pick up the wafer at the output pedestal of the sector, where wafer presence was noted, with the delivery of the wafer to the input pedestal of the next processing sector indicated in the "pattern generators destination register" associated with the pattern generating unit which is indicating a "wafer present" signal. Concurrently, as indicated in Step 270, this will also cause the transport busy indicator signal to be turned on until the move is completed whereupon the control system will return to Step 266 for repeating the determination therein.

In Step 268, a check is made of the "input pedestal status" of each pattern generating sector or unit 6 in turn, until an "available" pattern generating input pedestal is found, e.g. a pattern generating unit 6 having an input pedestal free of a wafer. If the determination of Step 268 indicates that there is no available pattern generating input pedestal, then the control system will return to Step 266 for repeating the determination indicated therefore. Conversely, if the determination of Step 268 indicates the existence of available input pedestal of a pattern generating unit 6, the control will proceed to Step 271.

With respect to Steps 267 and 268 and 271, it may be noted that priority scheduling in the control system is accomplished only as a "tie breaker", that is, if more than one move is possible at any instant in time, the polling sequence dictates the priority. Also, with respect to Step 269 it may be noted that it is not necessary to check the status of the receiving sectors input pedestal since a wafer would not have been sent to any pattern generating unit 6, if the next sectors input pedestal were occupied.

In Step 271, to the exclusion of pattern generating sectors 6, each remaining process sector (K), (where K equals K, K+1, K+2, . . . K+n), is checked for the existence of each of four conditions. The first condition to be determined in Step 271 is the determination as to whether a wafer is present, if not, then Step 271 is repeated for the next process sector (K+1) and the determination again reiterated through sector (K+n). If a wafer is found to be present on the output pedestal of a process sector (K) then the determination is made for the presence of the existence of three additional conditions. These conditions include the determination if the status of the next process sector (K+1) to which the wafer is to be transferred via a pattern generating unit 6. For this purpose a determination is made whether the pedestal of a processing sector (K+1) is available to receive a wafer, as well as a determination whether this sector (K+1) is operational. In addition a determination is made as to the absence of any wafer in any pattern generating unit 6 destined for sector (K+1). As indicated previously if the above conditions are not met by a sector, then the determination of Step 271 is repeated through the successive sectors. If the determination of Step 271 shows that no sector exists which meets all the conditions specified for this step, the control system will proceed to Step 272, wherein a determination will be made whether or not the last wafer in a series has been processed. If the determination of Step 272 is positive, then the system will proceed to Step 273 to terminate operation. Conversely, if the determination of Step 272 is negative, then the control system will return to Step 266 to repeat the determination therein.

If the determination of Step 271 shows that a sector (K) exists where all conditions specified in this determination are met, the control system will proceed to Step 274 where the transport system will be directed to pick up the wafer at the output pedestal of a sector (K) for delivery of it to the pattern generating unit 6 whose input pedestal was noted to be available in Step 268. Also, Step 275 will concurrently place the address of the next processing sector (K+1) to which the wafer is to be subsequently transferred, into the pattern generator destination register associated with the pattern generator to which the wafer has been moved. In addition, as indicated in Step 276, the transport system busy indicator will be turned on until the wafer move is completed whereupon the control system will return to Step 266 for again repeating the determination therein.

While the invention has been particularly shown and described with reference to a preferred embodiment thereof, it will be understood by those skilled in the art that the foregoing and other changes in form and detail may be made therein without departing from the spirit and scope of the invention.

What is claimed is:

1. A manufacturing system for processing semiconductor substrates comprising:

A. a plurality of processing stations having loading and unloading positions, each of said stations having means for performing different fixed processing operations on said substrates, B. a conveyor means for transporting individual ones of said substrates between and at any one of said work stations;

C. means for transferring said individual ones of said substrates between said conveyor and said stations at their said loading and unloading positions;

D. control means for said conveyor and transfer means for routing said substrates individually between any prescribed sequence of said stations for a corresponding prescribed series of processing operations, wherein E. said stations comprise means for performing a plurality of semiconductor processing operations from the group of epitaxial growth, metallization, photoresist pattern exposure, impurity diffusion, impurity drive-in, photoresist development, oxide etching, metal etching, photoresist stripping, formation of dielectric coatings, sputtering, ion implantations and photoresist coating operations.

2. The manufacturing system of claim 1 wherein at least one of said stations comprises means for sequentially cleaning said substrate, and deposition of a photoresist layer over said coating.

3. The manufacturing system of claim 1 wherein at least one of said stations includes means for applying a photoresist layer over said substrate as a final processing operation therein.

4. The manufacturing system of claim 3 wherein at least one of the remainder of said stations is adapted to receive said photoresist coated substrates, and comprises means for sequentially aligning and exposing the photoresist coating in a predetermined pattern specified in said prescribed sequence of processing operation.

5. The manufacturing system of claim 4 wherein at least one of another of said stations is adapted to receive said exposed photoresist coated substrate and includes means as an initial processing operation therein for developing said exposed resist to form a corresponding opening pattern to underlying portions of said substrate.

6. The manufacturing system of claim 5 wherein said another of said stations thereof includes means for applying a photoresist layer over said substrate as a final processing operation therein.

7. The manufacturing system of claim 5 wherein at least one another of said stations is adapted to receive a substrate with said exposed photoresist layer coated on a silicon oxide layer formed on said substrate and includes means as initial processing operations therein sequentially developing said photoresist to form a corresponding opening pattern to said silicon oxide layer, etching through said silicon oxide layer to underlying portions of said substrate, and stripping of the remaining portions of said photoresist layer from said silicon oxide layer.

8. The manufacturing system of claim 7 wherein said one another of said stations thereof includes means for applying a new photoresist layer over said substrate as a final processing operation therein, and means for performing at least one another semiconductor processing operation therein between said initial and final operation.

9. A manufacturing system for processing semiconductor substrates comprising:

A. a conveyor means for transporting said substrates individually between and at any selected one of a plurality of locations along the path thereof;

B. a plurality of processing stations at respective ones of said locations for performing semiconductor processing operations on said substrates, and having loading and unloading stations for corresponding feeding and discharging of individual ones of said substrates, with at least three required sequential ones of said stations having the first and third station disposed adjacent one end of said conveyor path and the second station of said sequence disposed adjacent the other end of said conveyor path;

C. means for transferring said individual ones of said substrates between said conveyor and said stations at their said loading and unloading stations;

D. control means for said conveyor and transfer means for routing said substrates individually between and at selected ones of a prescribed sequence of said stations for a corresponding sequence of processing operations therein, wherein E. said processing stations include means for performing a plurality of semiconductor processing operations from the group of oxide coating formation, epitaxial growth, metallization, photoresist pattern exposure, impurity diffusion, impurity drive-in, photoresist development, oxide etching, metal etching, photoresist dripping, formation of silicon nitride coatings, sputtering, ion implantations and photoresist coating operations.

10. The manufacturing system of claim 9 wherein at least one of said stations includes means for sequentially cleaning said substrate, formation of an oxide coating on said substrate, and deposition of a photoresist layer over said coating.

11. The manufacturing system of claim 9 wherein at least one of said stations includes means for applying a photoresist layer over said substrate as a first processing operation therein.

12. The manufacturing system of claim 11 wherein at least one of the remainder of said stations as adapted to receive said photoresist coated substrates, and comprises means for sequentially aligning and exposing the photoresist coating in a predetermined pattern specified in said prescribed sequence of processing operation.

13. The manufacturing system of claim 12 wherein at least one of another of said stations is adapted to receive said exposed photoresist coated substrate, and includes means, as initial processing operations therein, for developing said exposed resist to form a corresponding opening pattern to underlying portions of said substrate.

14. The manufacturing system of claim 12 wherein said another of said stations thereof includes means for applying a photoresist layer over said substrate as a final processing operation therein.

15. The manufacturing system of claim 12 wherein at least one another of said stations is adapted to receive a substrate with said exposed photoresist layer coated on a silicon oxide layer formed on said substrate and includes means as an initial processing operation therein sequentially developing said photoresist to form a corresponding opening pattern to said silicon oxide layer, etching through and said silicon oxide layer to underlying portions of said substrate, and stripping of the remaining portions of said photoresist layer.

16. The manufacturing system of claim 15 wherein said one another of said stations thereof includes means for applying a new photoresist layer over said substrate as a final processing operation therein, and means for performing at least one other semiconductor processing operation therein between said initial and final operation.

* * * * *